(12) United States Patent  
Schultz

(10) Patent No.: US 8,304,172 B2  
(45) Date of Patent: Nov. 6, 2012

(54) SEMICONDUCTOR DEVICE FABRICATION USING A MULTIPLE EXPOSURE AND BLOCK MASK APPROACH TO REDUCE DESIGN RULE VIOLATIONS

(75) Inventor: Richard Schultz, Fort Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 377 days.

(21) Appl. No.: 12/617,429

(22) Filed: Nov. 12, 2009

(65) Prior Publication Data

US 2011/0111348 A1 May 12, 2011

(51) Int. Cl.
*G03F 7/26* (2006.01)
(52) U.S. Cl. .................................. 430/313; 430/316
(58) Field of Classification Search .................. 430/311, 430/313
See application file for complete search history.

(56) References Cited

U.S. PATENT DOCUMENTS

| | | | |
|---|---|---|---|
| 6,204,187 B1* | 3/2001 | Rupp et al. | 438/702 |
| 6,362,113 B1* | 3/2002 | Wang | 438/738 |
| 2007/0231748 A1 | 10/2007 | Sivakumar et al. | |
| 2008/0305623 A1* | 12/2008 | Zhuang et al. | 438/587 |
| 2009/0286185 A1* | 11/2009 | Bae | 430/312 |

OTHER PUBLICATIONS

International Search Report issued Feb. 14, 2012 in PCT/US2010/055977.
Perret, D. et al., "Materials for Double Patterning Strategies: Development and Application," Microelectronic Engineering, 86, (2009) pp. 757-760.
International Preliminary Report on Patentability mailed May 24, 2012 in PCT/US2010/055977.

* cited by examiner

*Primary Examiner* — Kathleen Duda
(74) *Attorney, Agent, or Firm* — Ingrassia Fisher & Lorenz, P.C.

(57) ABSTRACT

A method of fabricating a semiconductor device begins by forming a layer of hard mask material on a substrate comprising a layer of semiconductor material and a layer of insulating material overlying the layer of semiconductor material, such that the layer of hard mask material overlies the layer of insulating material. A multiple exposure photolithography procedure is performed to create a combined pattern of photoresist features overlying the layer of hard mask material, and a recess line pattern is in the hard mask material, using the combined pattern of photoresist features. The method continues by covering designated sections of the recess line pattern with a blocking pattern of photoresist features, and forming a pattern of trenches in the insulating material, where the pattern of trenches is defined by the blocking pattern of photoresist features and the hard mask material. Thereafter, an electrically conductive material is deposited in the trenches, resulting in conductive lines for the semiconductor device.

18 Claims, 20 Drawing Sheets

SEMICONDUCTOR DEVICE FABRICATION USING A MULTIPLE EXPOSURE AND BLOCK MASK APPROACH TO REDUCE DESIGN RULE VIOLATIONS

CROSS-REFERENCE TO RELATED APPLICATION

The subject matter of this application is related to the subject matter of co-pending U.S. patent application Ser. No. 12/617,421, filed on Nov. 12, 2009.

TECHNICAL FIELD

Embodiments of the subject matter described herein relate generally to semiconductor device fabrication techniques and technologies. More particularly, embodiments of the subject matter relate to the design, creation, and use of photolithographic masks to reduce design rule violations during the manufacture of semiconductor devices.

BACKGROUND

The semiconductor industry aims to manufacture integrated circuits with higher and higher densities of semiconductor devices on a smaller chip area to achieve greater functionality and to reduce manufacturing costs. This desire for large scale integration has led to a continued shrinking of circuit dimensions and device features. The ability to reduce the size of structures, such as gate lengths in field-effect transistors and the width of conductive lines, is driven by lithographic performance.

With conventional photolithography systems, radiation is provided through or reflected off a mask or reticle to form an image on a semiconductor wafer. Generally, the image is focused on the wafer to expose and pattern a layer of material, such as photoresist material. In turn, the photoresist material is utilized to define doping regions, deposition regions, etching regions, or other structures and features in one or more layers of the semiconductor wafer. The photoresist material can also define conductive lines or conductive pads associated with metal layers of a semiconductor device. Further, the photoresist material can define isolation regions, transistor gates, or other transistor structures and elements.

A multiple exposure/pattern process, which utilizes two or more photolithographic sub-processes, can be used to form photoresist patterns of extremely small and tightly packed features. One type of double exposure process forms a first photoresist pattern, etches the wafer using the first photoresist pattern, subsequently forms a second photoresist pattern, and etches the wafer using the second photoresist pattern. Another type of double exposure process forms a first photoresist pattern, coats the first photoresist pattern with a second photoresist layer, exposes and develops the second photoresist layer, and then etches the wafer. This double exposure process is sometimes referred to as a double exposure single etch process.

Currently available photolithography tools used in the semiconductor industry can achieve line resolutions of about 80 nanometers. More specifically, 193 nanometer immersion stepper technology can achieve pitches as short as 80 nanometers on a single mask. In practice, device features having pitches below 80 nanometers can be achieved using double exposure/pattern processes as mentioned above. Unfortunately, even if multiple exposure procedures are used, downward scaling of pitch or line separation is ultimately limited by the practical performance capabilities of the photolithographic tools. Consequently, certain design rules are commonly used to check the viability and manufacturability of desired semiconductor device features. For example, design rule check (DRC) methodologies can be applied to identify potential tip-to-tip and/or tip-to-line violations in a proposed layout of conductive traces, such as local interconnects. Thus, if the proposed layout includes tip-to-tip or tip-to-line spacing that is too short for the particular photolithographic tool, then it may not be possible to fabricate devices using that proposed layout without shorting some conductive traces together.

BRIEF SUMMARY OF EMBODIMENTS

A method of creating device features on a semiconductor device structure is provided. The method involves creating a first pattern of photoresist features overlying a target material of the semiconductor device structure, the first pattern of photoresist features defined by a first component photolithographic mask. The method also creates a second pattern of photoresist features overlying the target material, the second pattern of photoresist features defined by a second component photolithographic mask. The first pattern of photoresist features and the second pattern of photoresist features together form a combined pattern of photoresist features. The method continues by selectively etching the target material, using the combined pattern of photoresist features as an etch mask. This results in a recess line pattern formed in the target material. The method then forms a third pattern of photoresist features that cover designated sections of the recess line pattern.

Also provided is a method of fabricating a semiconductor device. This method begins by providing a semiconductor device structure comprising a layer of semiconductor material and a layer of insulating material overlying the layer of semiconductor material. The method proceeds by forming a layer of hard mask material overlying the layer of insulating material, and by creating a combined pattern of photoresist features overlying the layer of hard mask material. The combined pattern of photoresist features comprises first photoresist features formed using a first photolithographic mask and second photoresist features formed using a second photolithographic mask. The method continues by selectively etching the layer of hard mask material using the combined pattern of photoresist features as an etch mask, resulting in a positive hard mask pattern and a negative recess line pattern defined in the hard mask material. The method also creates a pattern of additional photoresist features overlying the insulating material. The additional photoresist features intersect one or more recess lines defined in the negative recess line pattern.

Another method of fabricating a semiconductor device is provided. This method forms a layer of hard mask material on a substrate comprising a layer of semiconductor material and a layer of insulating material overlying the layer of semiconductor material, the layer of hard mask material overlying the layer of insulating material. The method continues by performing a multiple exposure photolithography procedure to create a combined pattern of photoresist features overlying the layer of hard mask material, and by forming a recess line pattern in the hard mask material. The recess line pattern is defined by the combined pattern of photoresist features. The method then covers designated sections of the recess line pattern with a blocking pattern of photoresist features, and forms a pattern of trenches in the insulating material. The pattern of trenches is defined by the blocking pattern of photoresist features and the hard mask material. The method then deposits an electrically conductive material in the trenches, resulting in conductive lines for the semiconductor device.

Also provided is a method of creating photolithographic masks for semiconductor device features with reduced tip-to-tip and tip-to-line violations. This method provides preliminary data that represents a desired mask pattern, and analyzes the preliminary data to identify tip-to-tip and tip-to-line violations in the desired mask pattern. The method modifies the preliminary data in accordance with the identified violations to obtain updated data that represents a modified mask pattern; the modified mask pattern is void of tip-to-tip and tip-to-line violations. The method then generates a photolithographic mask having the modified mask pattern, using the updated data.

Also provided is another method of creating photolithographic masks for semiconductor device features with reduced design rule violations. This method provides preliminary data that represents an overall mask pattern, processes the preliminary data to decompose the overall mask pattern into a plurality of component mask patterns, and performs a design rule check on the plurality of component mask patterns to identify tip-to-tip and tip-to-line violations in the plurality of component mask patterns. This results in identified violations. The method continues by modifying at least one of the plurality of component mask patterns in accordance with the identified violations to obtain a modified set of component mask patterns, wherein each mask pattern in the modified set of component mask patterns is void of tip-to-tip and tip-to-line violations. The method then creates photolithographic masks for the modified set of component mask patterns.

A photolithography method for semiconductor features with reduced design rule violations is also provided. This method begins by providing an overall mask pattern. The overall mask pattern is decomposed into a first component mask pattern and a second component mask pattern. The method continues by identifying design rule violations in at least the first component mask pattern, resulting in identified violations. The method then modifies the first component mask pattern in accordance with the identified violations to obtain a modified first component mask pattern, the modified first component mask pattern being void of design rule violations. The method also generates a block mask pattern in accordance with the identified violations, the block mask pattern being void of design rule violations, and creates photolithographic masks corresponding to the modified first component mask pattern, the second component mask pattern, and the block mask pattern.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
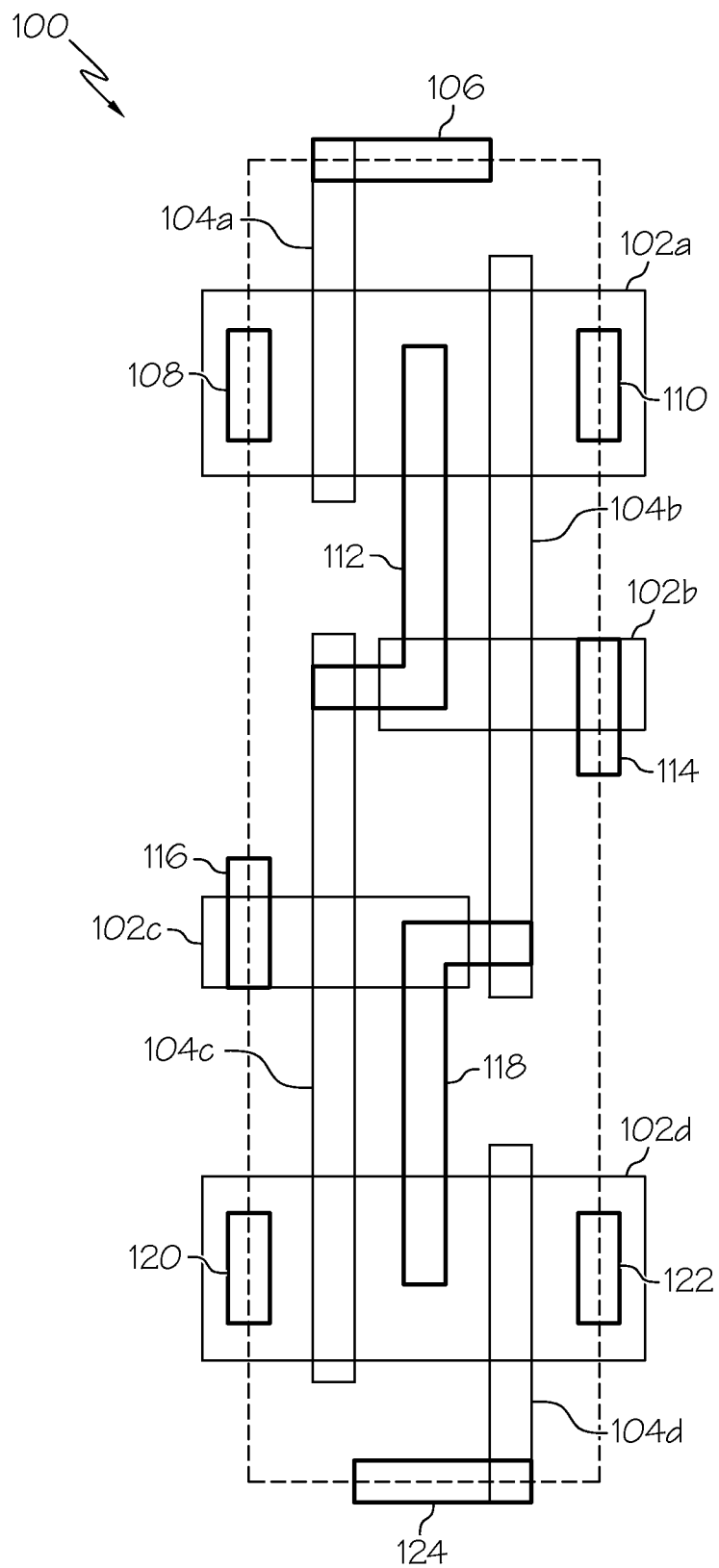
FIG. 1 is a top and partially phantom view of an exemplary static random access memory (SRAM) cell, showing a layout of bidirectional local interconnects.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain techniques and technologies may be described herein with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. When implemented in software or firmware, certain methods described herein may be represented by the code segments or instructions that perform the various tasks. The program or code segments can be stored in a processor-readable medium or transmitted by a computer data signal embodied in a carrier wave over a transmission medium or communication path. In this regard, a "processor-readable medium" or "machine-readable medium" may include any medium that can store or transfer information. Examples of the processor-readable medium include, without limitation: an electronic circuit, a semiconductor memory device, a ROM, a flash memory, an erasable ROM (EROM), a floppy diskette, a CD-ROM, an optical disk, a hard disk, or the like.

Photolithography and various photolithographic techniques are used during the manufacture of semiconductor devices. Such techniques can be used to form patterns of photoresist material on a semiconductor wafer, where such patterns define the boundaries of features, regions, and/or areas to be formed, treated, or processed. For example, photolithography can be used to define a layout of local interconnects, active semiconductor regions, gate structures, sidewall spacers, etch masks, ion implantation masks, or the like. In this regard, a typical photolithographic system employs a radiation source, optics (e.g., a lens, mirror, or liquid such as water), a mask, and a stage for the wafer undergoing photolithography. Such a photolithographic system is configured to transfer a pattern or image provided on the mask to a target material or surface of the wafer.

A photoresist layer is formed overlying the intended target material of the wafer. The target material can be an insulative layer, a conductive layer, a barrier layer, or any target material to be etched, doped, treated, processed, or layered. For example, the target material could be, without limitation: polycrystalline silicon; a silicide material; a hard mask layer such as a silicon nitride material; an anti-reflective coating; or any suitable conductive, semiconductive, or insulative material. The photoresist layer can comprise a variety of photoresist materials, compositions, or chemicals suitable for lithographic applications. The photoresist layer is selected to have photochemical reactions in response to electromagnetic radiation emitted from a radiation source, and to have sufficient transparency to the electromagnetic radiation to allow useful patterning of the photoresist layer. Materials suitable for the photoresist layer can include, among others, a matrix material or resin, a sensitizer or inhibitor, and a solvent. The photoresist layer may be a chemically amplified, positive or negative tone, organic-based photoresist. The photoresist layer may also be a silicon-containing photoresist. For example, the photoresist layer may be, but is not limited to, an acrylate-based polymer, an alicyclic-based polymer, or a phenolic-based polymer.

For the various embodiments described here, a layer of photoresist material can be formed over a target material or layer of a semiconductor device structure using any suitable technique, for example, deposition by spin coating. The thickness of a given photoresist layer is selected according to the particular lithographic technology, e.g., for use in vacuum ultraviolet (VUV) lithography, deep ultraviolet (DUV) lithography, and/or extreme ultraviolet (EUV) lithography (using, for example, exposing light having a wavelength of 193 nm, 157 nm, 126 nm, or 13.4 nm). In this regard, a particular photoresist layer may have a thickness in the range of 15-1000 nm, with a preferred thickness in the range of 50-500 nm.

The optics used by a photolithography system are suitably configured to focus and direct a pattern of radiation (i.e., radiation from the radiation source as modified by a pattern or image provided on a mask) onto a photoresist layer. In certain embodiments, the mask is a binary mask that includes a transparent or translucent substrate (e.g., glass or quartz) and an opaque or patterned layer (which may be formed from chromium or chromium oxide) thereon. The opaque layer provides a pattern or image associated with a desired circuit pattern, features, or devices to be projected onto the photoresist layer. Alternatively, the mask may be an attenuating phase shift mask, an alternating phase shift mask, or other type of mask.

A number of semiconductor transistor manufacturing processes call for self-aligned features, such as self-aligned contact to gate features and/or self-aligned local interconnect to gate features. Self-alignment is utilized to avoid contact-to-gate shorts and to allow channel length scaling at small node technologies (e.g., 20 nm and smaller technologies). The techniques and technologies described here take advantage of a process flow with a bidirectional local interconnect pattern that is self-aligned, resulting in much tighter tip-to-tip and tip-to-line spacing relative to conventional local interconnect patterned solutions that use two photolithographic masks.

Using current photolithographic tools (e.g., 193 nm immersion stepper), device features having pitches below 80 nm can be created using well known double patterning approaches. However, solutions that achieve pitches below 80 nm with a double patterning technique are limited by the tip-to-tip and tip-to-line spacing requirements for each individual photolithographic mask. As used here, "tip-to-tip" refers to the distance or length between the ends or tips of two adjacent features, where the ends or tips are generally oriented in a coaxial manner. As used here, "tip-to-line" refers to the distance of length between the end or tip of one feature and a side edge of another feature, where the end or tip of the first feature is generally oriented orthogonally to the side edge of the second feature. To address the limitations associated with tip-to-tip and tip-to-line violations, a three-mask approach is provided here. The three-mask solution employs two masks (used for double patterning of a hard mask material) in conjunction with a blocking mask that allows for much smaller tip-to-tip and tip-to-line spacing. This three-mask approach can be used, for example, to scale an SRAM bit cell to enable a cost efficient solution without the need to use EUV technology, which at this time is not quite ready for volume production of semiconductor devices.

Although the techniques described here can be employed to create various features, regions, elements, and/or structures on a semiconductor device or wafer, the exemplary embodiments presented below relate to the formation of bidirectional local interconnect patterns for an SRAM device. These exemplary embodiments are not exhaustive, and are not intended to limit or otherwise restrict the scope or application of the described subject matter. Local interconnect patterns are mentioned here because they are relatively difficult to scale using conventional semiconductor device fabrication technologies.

FIG. 1 is a top and partially phantom view of an exemplary 6T SRAM cell 100, showing a layout of bidirectional local interconnects. Although a 6T cell is illustrated, the techniques and concepts described here can also be applied to other SRAM cell topologies, such as 4T, 8T, 10T, etc. FIG. 1 depicts features of the SRAM cell 100 in a simplified and phantom manner that best illustrates the concepts presented here. Moreover, the specific layout of the SRAM cell 100 is merely exemplary, and the depicted layout is not intended to limit or restrict the scope of the described subject matter. This embodiment of the SRAM cell 100 includes four active semiconductor regions 102 and four gate structures 104 that cooperate to form six transistor devices. Although not readily apparent from the perspective of FIG. 1, the gate structures 104 are formed overlying the active semiconductor regions 102, as is well understood. The gate structures 104 are considered to be unidirectional because they are all generally oriented in the same direction (vertically in FIG. 1).

The SRAM cell 100 also includes a plurality of local interconnects, which are formed from an electrically conductive material such as a tungsten material or any suitable metal material. This particular embodiment includes: a local interconnect 106 coupled to the gate structure 104*a*; two local interconnects 108/110 coupled to the active semiconductor region 102*a*; a bidirectional local interconnect 112 coupled to the gate structure 104*c*, the active semiconductor region 102*b*, and the active semiconductor region 102*a*; a local interconnect 114 coupled to the active semiconductor region 102*b*; a local interconnect 116 coupled to the active semiconductor region 102*c*; a bidirectional local interconnect 118 coupled to the gate structure 104*b*, the active semiconductor region 102*c*, and the active semiconductor region 102*d*; two local interconnects 120/122 coupled to the active semiconductor region 102*d*; and a local interconnect 124 coupled to the gate structure 104*d*. Although not readily apparent from the perspective of FIG. 1, the local interconnects are formed overlying the active semiconductor regions 102, overlying the gate structures 104, and/or overlying other areas of the semiconductor substrate (in FIG. 1, these other areas lack any discernable device features). The local interconnects 112 and 118 are considered to be bidirectional because each one is generally oriented in two different directions (vertically and horizontally in FIG. 1). The specific electrical couplings and the layout of the SRAM cell 100 satisfy well known principles and requirements for operation of a 6T SRAM cell, and the operation of the SRAM cell 100 will not be described in detail here.

Figure 2:
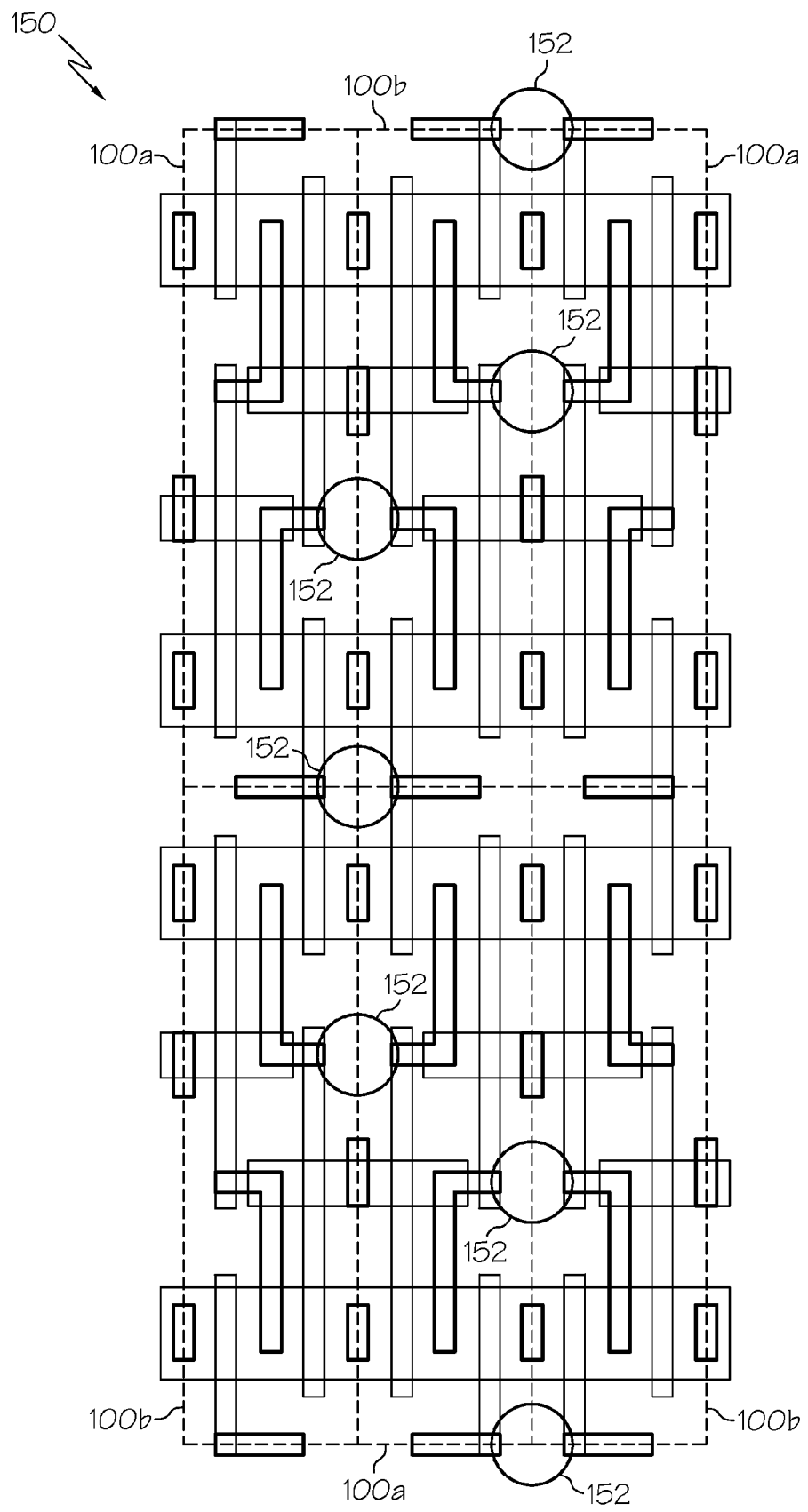
FIG. 2 is a top and partially phantom view of a three-by-two array of SRAM cells based on the SRAM cell shown in FIG. 1.

In practice, a single SRAM cell will be fabricated many times on a single semiconductor substrate to provide a high amount of memory capacity. For example, the SRAM cell 100 could be duplicated many times as an array of SRAM cells on a single semiconductor device structure. In this regard, FIG. 2 is a top and partially phantom view of a three-by-two array of SRAM cells 150, which is based on the SRAM cell 100. The array of SRAM cells 150 includes three SRAM cells 100a that have the same layout shown in FIG. 1, and three SRAM cells 100b that have a mirror image layout of that shown in FIG. 1. This allows neighboring cells in the array of SRAM cells 150 to share certain features or elements. For example, neighboring cells may share certain active semiconductor regions and/or certain local interconnects.

A practical SRAM device might use an array of millions of cells, and manufacturers strive to reduce the physical size of SRAM devices. Certain design rules (which are based on practical manufacturing tolerances and limitations) limit the amount by which some features can be downwardly scaled. For example, design rules dictate the minimum tip-to-tip and tip-to-line spacing between adjacent mask features to avoid shorting or merging of features together (which may be caused by practical limitations of photolithography tools). Accordingly, it may not be practical or feasible to manufacture a proposed layout for an SRAM device if that proposed layout contains potential design rule violations (e.g., tip-to-tip or tip-to-line violations). In this regard, FIG. 2 identifies several potential tip-to-tip violations 152 that are associated with a single photolithographic mask for the array of SRAM cells 150. The circled regions in FIG. 2 correspond to these tip-to-tip violations 152. In FIG. 2, all of the tip-to-tip violations 152 relate to local interconnect features that are horizontally oriented. For this example, the array of SRAM cells 150 includes no tip-to-line violations, although the approaches described herein can also be used to address tip-to-line violations and to address any combination of tip-to-tip and tip-to-line violations.

Figure 3:
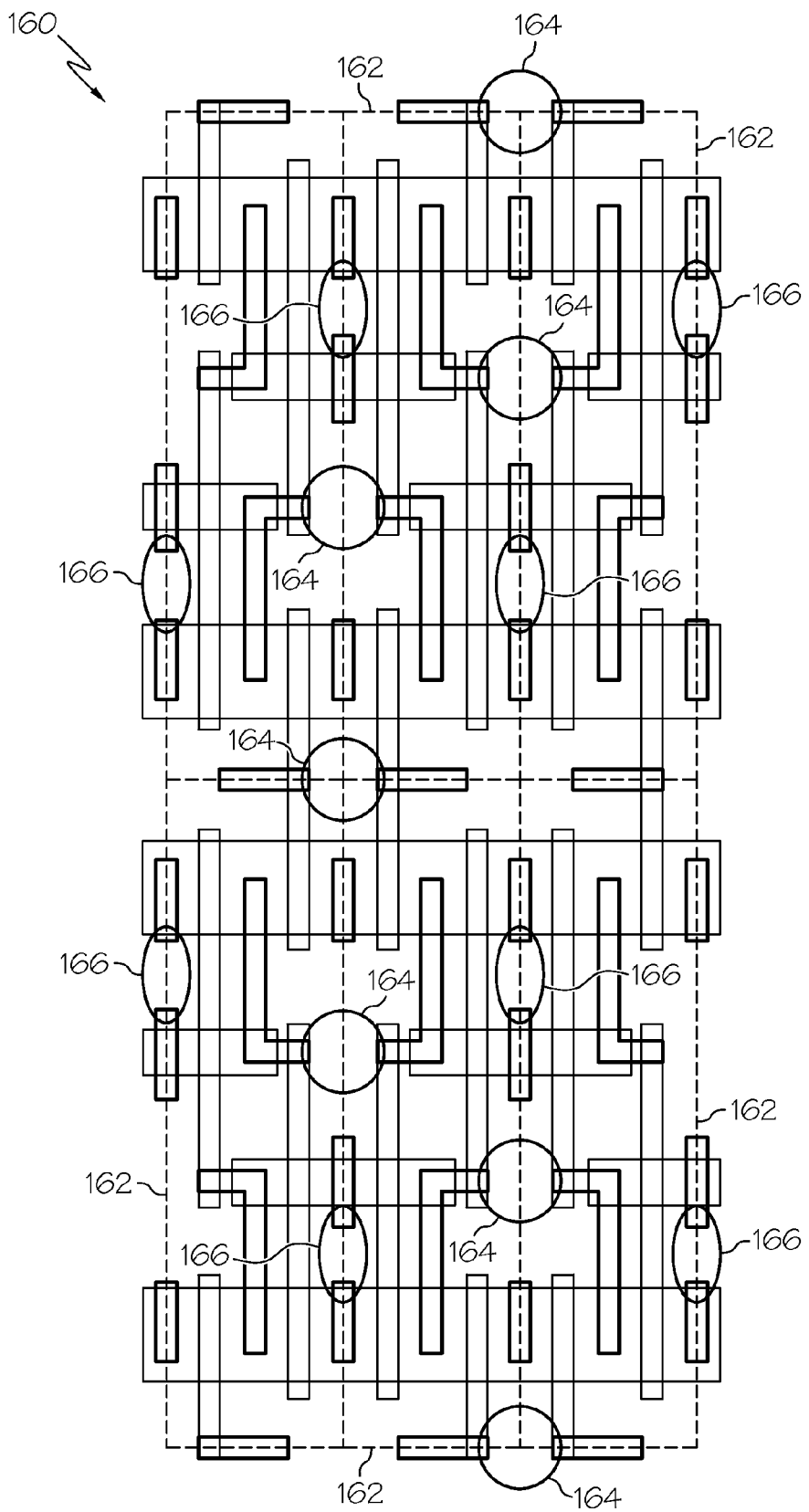
FIG. 3 is a top and partially phantom view of a three-by-two array of SRAM cells based on an alternate SRAM cell layout.

FIG. 3 is a top and partially phantom view of another three-by-two array of SRAM cells 160 that is based on an alternate SRAM cell layout. The array of SRAM cells 160 includes six iterations of an SRAM cell 162 (including three mirror image versions). The overall layout of the array of SRAM cells 160 is generally similar to the layout of the array of SRAM cells 150 depicted in FIG. 2. Unlike the array of SRAM cells 150, however, the array of SRAM cells 160 includes potential tip-to-tip violations that are vertically oriented. Thus, FIG. 3 depicts a number of horizontal tip-to-tip violations 164 in addition to several vertical tip-to-tip violations 166. Notably, the horizontal tip-to-tip violations 164 are associated with one photolithographic mask, while the vertical tip-to-tip violations are associated with another photolithographic mask. This aspect will be explained in more detail below.

Due to the presence of the design rule violations, it may not be possible to fabricate the array of SRAM cells 150 or the array of SRAM cells 160 using conventional techniques without resulting in shorts between adjacent local interconnect features. The mask generation and semiconductor fabrication techniques and technologies described below address this issue and facilitate the manufacture of semiconductor devices (such as SRAM devices) with sub-80 nanometer resolution by eliminating potential tip-to-tip and tip-to-line violations in the masks used during multiple patterning photolithography.

Figure 4:
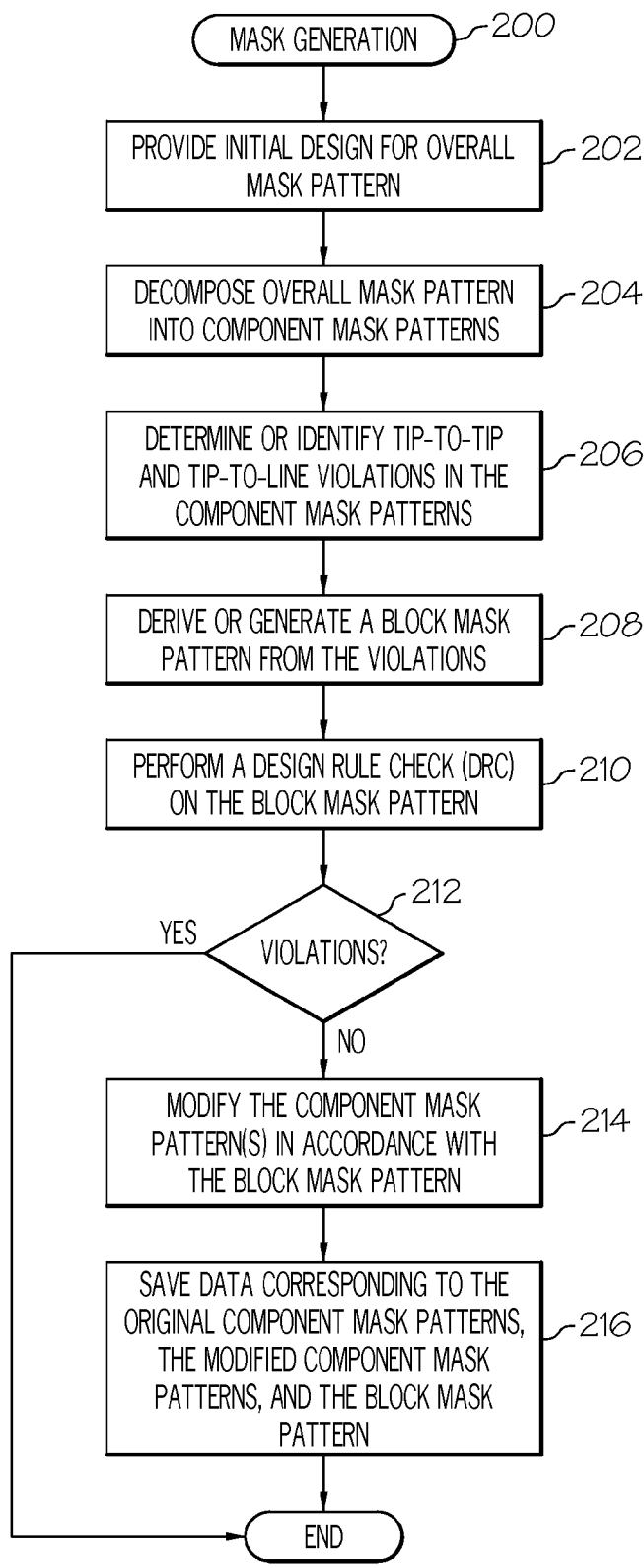
FIG. 4 is a flow chart that illustrates an exemplary embodiment of a mask generation process.

The exemplary multiple mask solution described here uses at least two masks for a multiple patterning procedure on a semiconductor device structure. The creation of a hard mask and a subsequent block mask allows for closer tip-to-tip and tip-to-line spacing without introducing design rule violations in any of the photolithographic masks. In this regard, FIG. 4 is a flow chart that illustrates an exemplary embodiment of a mask generation process 200 that can be executed to create a set of photolithographic masks for use during a semiconductor manufacturing process. The process 200 represents an exemplary method of creating photolithographic masks for semiconductor device features with reduced design rule violations (relative to conventional approaches). The various tasks performed in connection with process 200 may be performed by software, hardware, firmware, or any combination thereof. In practice, portions of process 200 may be performed by one or more computing devices, computer systems, or processing hardware that is suitably configured to execute an appropriate software program having computer-readable and/or processor-executable instructions that, when executed, cause the host computing device or processor to carry out the described tasks. For example, the process 200 could be incorporated or integrated into a computer-aided design application suitable for use with semiconductor device designs, a design rule checking application appropriate for semiconductor device designs, or the like. It should be appreciated that process 200 may include any number of additional or alternative tasks, the tasks shown in FIG. 4 need not be performed in the illustrated order, and process 200 may be incorporated into a more comprehensive procedure or process having additional functionality not described in detail herein. Furthermore, an embodiment of the process 200 might omit one or more of the tasks illustrated in FIG. 4 (as long as the overall functionality is preserved).

The process 200 may begin by obtaining, creating, or providing an initial design for an overall desired mask pattern (task 202). In certain CAD deployments, task 202 may provide preliminary data that represents the desired mask pattern, where the preliminary data indicates the layout, dimensions, arrangement, orientation, and relative positioning of the features defined by the overall mask pattern (using any suitable reference or coordinate system, as is well understood). This example contemplates the creation of the local interconnects for the array of SRAM cells 150 shown in FIG. 2. Accordingly, task 202 may provide, obtain, or store data indicative of the desired local interconnect layout of the SRAM cell 100 (FIG. 1) and/or data indicative of the interconnect layout of the array of SRAM cells 150 (FIG. 2).

This embodiment of process 200 assumes that the overall mask pattern will be created using a multiple exposure/pattern procedure (e.g., a litho-litho-etch (LLE) procedure, a litho-etch-litho-etch (LELE) procedure, a litho-freeze-litho-etch (LFLE) procedure, or the like). In certain practical embodiments, the process 200 employs an LELE procedure because LELE is a somewhat robust and established technology. Accordingly, the overall mask pattern is decomposed into a plurality of different component mask patterns (task 204). In practice, task 204 may process or analyze the preliminary data, which is indicative of the overall mask pattern, in an appropriate manner to perform the decomposition. Although any number of component mask patterns could be generated, this example decomposes the overall mask pattern into a first component mask pattern and a second component mask pattern. The process 200 may leverage existing or conventional decomposition techniques, software applications, and technologies. Accordingly, the specific decomposition technique employed by task 204 will not be described in detail here.

Figure 5:
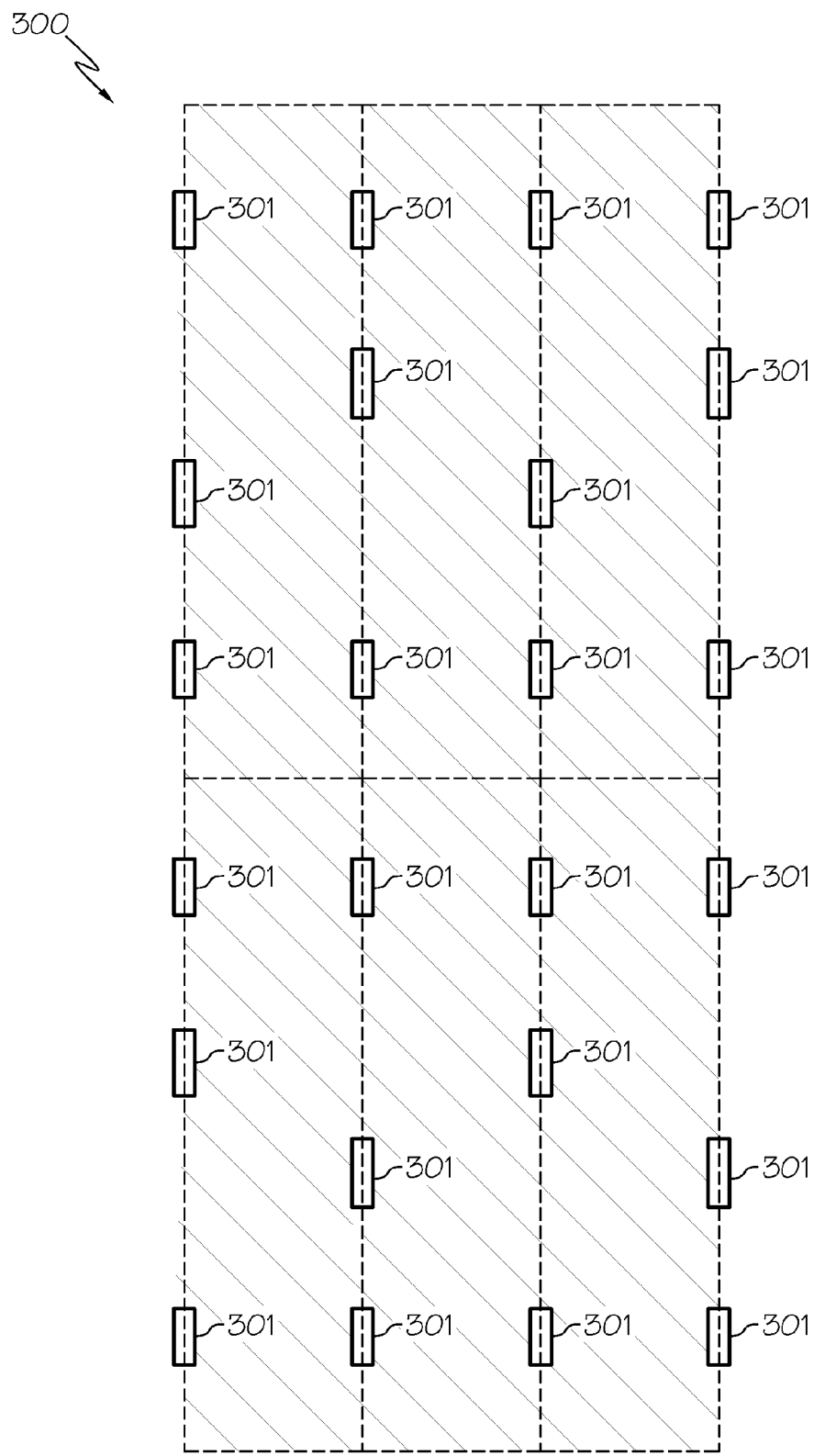
FIG. 5 is a top view of a first component mask pattern.
Figure 6:
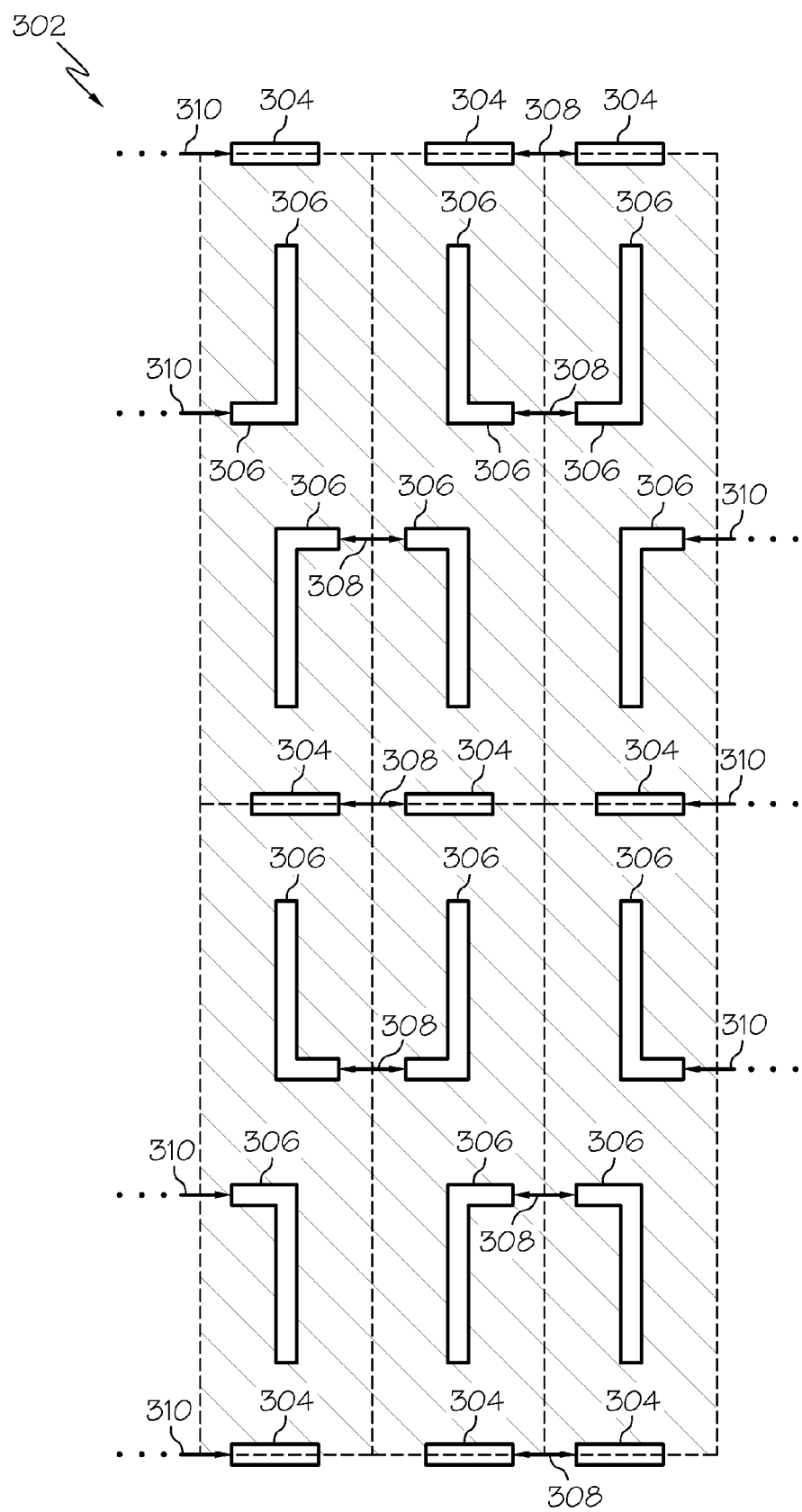
FIG. 6 is a top view of a second component mask pattern.

The exemplary component mask patterns generated by task 204 are depicted in FIG. 5 and FIG. 6, where FIG. 5 is a top view of the first component mask pattern 300 and FIG. 6 is a top view of the second component mask pattern 302. The first component mask pattern 300 defines the short vertically oriented local interconnects that reside at the boundaries of the individual SRAM cells. The mask features 301 in the first component mask pattern 300 are also found in the array of SRAM cells 150 shown in FIG. 2. The second component mask pattern 302 includes mask features 304 that define the horizontally oriented local interconnects that reside at the boundaries of the individual SRAM cells. The second component mask pattern 302 also includes mask features 306 that define the bidirectional local interconnects that reside within the boundaries of the individual SRAM cells. The mask features 304/306 are also found in the array of SRAM cells 150 shown in FIG. 2. The features on both of these mask patterns are "negative" because the resulting patterns of photoresist material that are formed on the semiconductor substrate will include spaces or holes having outlines that correspond to the mask features 301/304/306. In other words, there will be a lack of photoresist material wherever the mask features 301/304/306 appear in FIG. 5 and FIG. 6.

The process 200 may then proceed by analyzing the component mask patterns to identify certain design rule violations in the component mask patterns (task 206). For current generation 193 nm immersion stepper tools, tip-to-tip or tip-to-line spacing less than about 90-112 nm is considered to be a design rule violation. In practice, task 206 may be associated with a suitable design rule check (DRC) procedure that determines the presence of tip-to-tip and/or tip-to-line violations in the component mask patterns. Thus, task 206 may be performed by appropriate processing hardware that analyzes data indicative of the component mask patterns using an appropriate DRC application, program, or algorithm. This example assumes that the first component mask pattern 300 is free of any tip-to-tip or tip-to-line violations. On the other hand, this example assumes that task 206 identifies some tip-to-tip violations in the second component mask pattern 302 (no tip-to-line violations are present in the second component mask pattern 302). In FIG. 6, the identified violations 308 are represented by double headed arrows. FIG. 6 also depicts some identified violations 310 using arrows and ellipses; these identified violations 310 are located at the outer boundary of the array, and contemplate actual violations that will arise in the presence of adjacent cells. It should be understood that the process 200 might find design rule violations in only one of the component mask patterns, in all of the component mask patterns, or in some but not all of the component mask patterns, depending upon the particular layout of the overall mask pattern and depending upon the manner in which task 204 decomposes the overall mask pattern into its component mask patterns.

Figure 7:
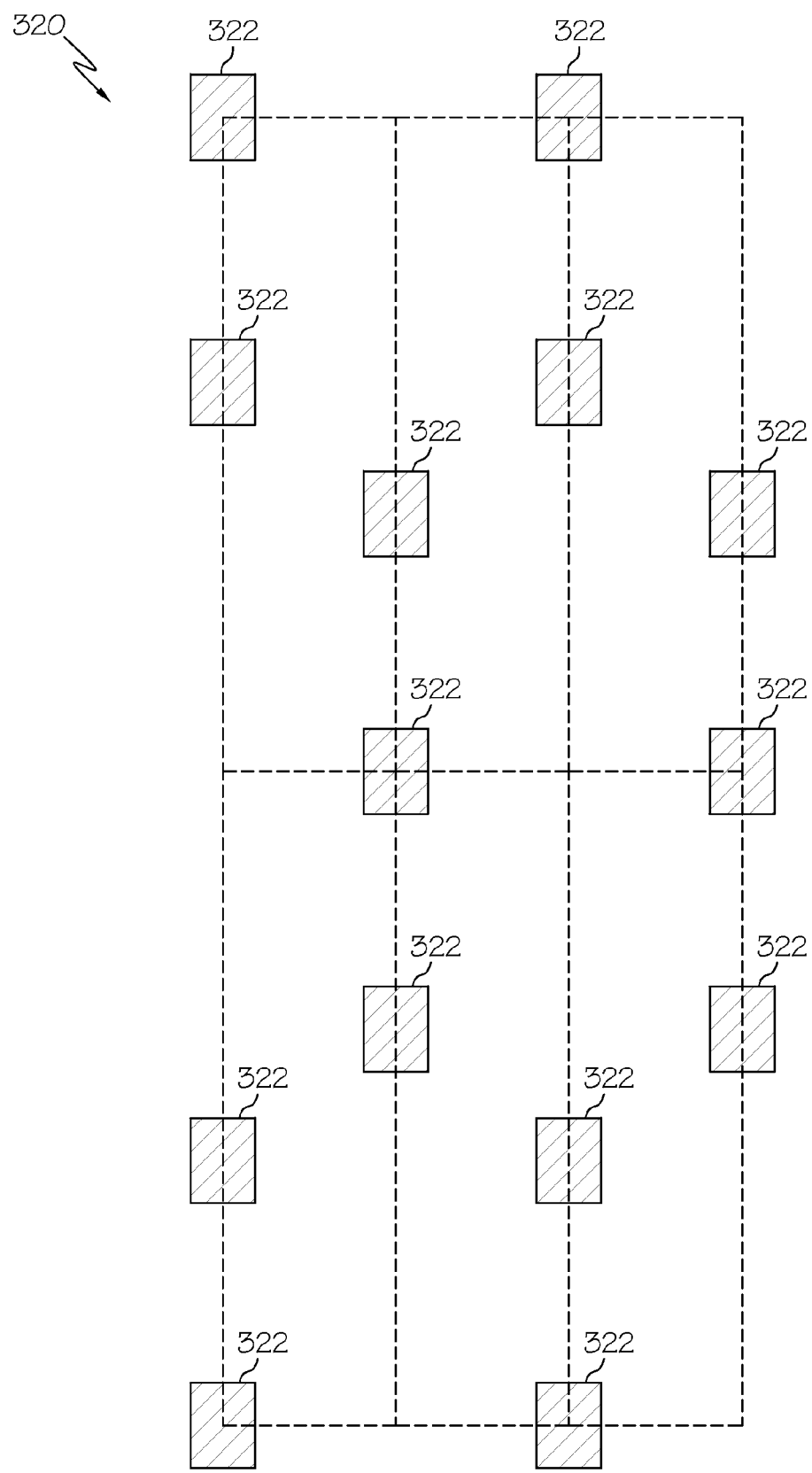
FIG. 7 is a top view of a block mask pattern.

In certain embodiments, task 206 may determine the dimensions, locations, positions, and/or arrangement of the identified violations using, for example, the same reference, coordinate, or measurement system utilized for the overall mask pattern. This information can then be used to derive or generate a photolithographic block mask pattern (task 208). In this regard, the block mask pattern will have features that are derived from, obtained from, or otherwise influenced by the dimensions of the identified violations. In practice, task 208 may be performed by appropriate processing hardware that derives the block mask data in accordance with the identified violations. As described in more detail below, the block mask pattern is used to selectively block the formation of features on a semiconductor device structure during the fabrication process. FIG. 7 is a top view of one exemplary block mask pattern 320 that might be generated during task 208. It should be appreciated that task 208 could generate a block mask pattern corresponding to the desired array (as depicted in FIG. 7), or it could generate a block mask pattern corresponding to only one cell.

The block mask pattern 320 includes mask features 322 that correspond to the identified design rule violations (see FIG. 6). In contrast to the mask features 301/304/306 depicted in FIG. 5 and FIG. 6, the mask features 322 on the block mask pattern 320 are "positive" because the resulting pattern of photoresist material formed on the semiconductor substrate will correspond to the mask features 322. In other words, photoresist material will remain wherever the mask features 322 are present. The location and width of each mask feature 322 is based upon the location and width of its respective design rule violation. In practice, the dimensions of the mask features 322 may be equal to the respective dimensions of the identified design rule violations. Alternatively, the mask features 322 could be scaled if needed to address process variations and/or characteristics of the manufacturing tools, such that the dimensions of the mask features 322 are not equal to the respective dimensions of the identified design rule violations. For example, it may be desirable to have the mask features 322 slightly larger/smaller than their counterpart violations (in practice, the mask features 322 are typically scaled up, i.e., slightly larger than the size of the counterpart violations). Moreover, when tip-to-tip and tip-to-line violations are considered, the identified violations will typically specify one dimension, i.e., the spacing between two adjacent tips or the spacing between a tip and a line. The block mask pattern 320, however, includes mask features 322 defined in two dimensions. For this example, the horizontal dimension of the mask features 322 corresponds to the dimension of the identified violations. Task 208 also calculates the vertical dimensions of the mask features 322 to avoid unwanted interference with mask features found on the component mask patterns, for reasons that will become apparent from the following description.

In certain embodiments, the block mask generated during task 208 is subjected to a DRC procedure (task 210) to check for design rule violations in the block mask itself. Thus, task 210 could be performed by appropriate processing hardware that analyzes the block mask data using an appropriate DRC application, program, or algorithm to identify any tip-to-tip and/or tip-to-line violations in the block mask. If the block mask contains tip-to-tip or tip-to-line violations (query task 212), then the process 200 may exit, initiate a redesign of the overall mask pattern, attempt to decompose the overall mask pattern in a different manner, or take other action as appropriate. Moreover, although not described in detail here, it may be desirable or necessary to create and use more than one block mask pattern using the techniques and approaches mentioned above. For example, multiple block mask patterns might be used if a single block mask pattern cannot be created without any violations.

If the DRC on the block mask is clean and the block mask is void of design rule violations, then the process 200 may continue by modifying at least one of the component mask patterns in accordance with the block mask pattern and/or in accordance with the identified violations (task 214). When executed, task 214 will modify the preliminary data corresponding to a desired mask pattern (e.g., the second component mask pattern 302 shown in FIG. 6) to obtain updated data that represents a modified mask pattern. Task 214 is executed such that the modified mask pattern is void of design rule violations such as tip-to-tip violations and tip-to-line violations. Thus, the modifying performed during task 214 will be influenced by the dimensions of the identified violations and/or the dimensions of the features in the block mask pattern.

Figure 8:
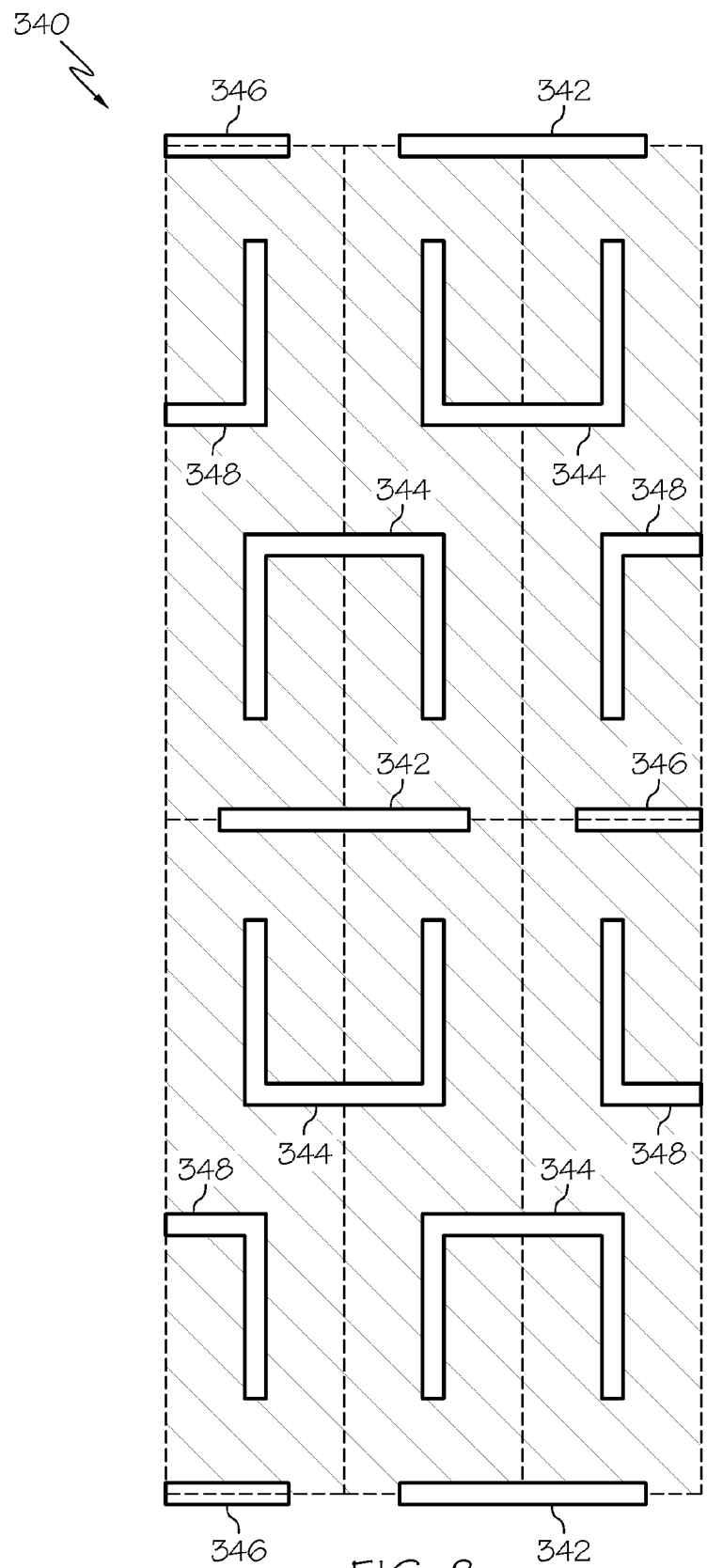
FIG. 8 is a top view of a modified version of the second component mask pattern shown in FIG. 6.

The process 200 can modify only one of the component mask patterns, all of the component mask patterns, or some but not all of the component mask patterns, depending upon the particular layout of the overall mask pattern and depending upon the manner in which task 204 decomposes the overall mask pattern into its component mask patterns. The simple example described here assumes that the first component mask pattern 300 (FIG. 2) remains unmodified and that only the second component mask pattern 302 (FIG. 3) is modified. In this regard, FIG. 8 is a top view of a modified version of the second component mask pattern 302. This exemplary embodiment of the modified mask pattern 340 includes all of the mask features of the second component mask pattern 302, along with additional mask features that "fill in" the space or gaps that correspond to the identified violations 308/310. Accordingly, the preliminary data for the second component mask pattern 302 is modified such that the updated data represents a merged or blended version of the second component mask pattern 302 having defined features in lieu of the identified violations 308/310. In other words, the original second component mask pattern 302 can be processed and changed into the modified mask pattern 340 by replacing the identified violations 308/310 with defined features.

Referring to FIG. 8, the modified mask pattern 340 includes three merged mask features 342 that each encompass two of the mask features 304 found in the second component mask pattern 302. Notably, each of the merged mask features 342 is a single and continuous feature having no tip-to-tip or tip-to-line violation. The modified mask pattern 340 also includes four U-shaped merged mask features 344 that each encompass two of the mask features 306 found in the second component mask pattern 302. Notably, each of the U-shaped merged mask features 344 is a single and continuous feature having no tip-to-tip or tip-to-line violation. The modified mask pattern 340 also includes three extended mask features 346, each of which represents an extended version of a respective mask feature 304 located near the boundary of the second component mask pattern 302. Similarly, the modified mask pattern 340 includes four extended L-shaped mask features 348, each of which represents an extended version of a respective mask feature 306 located near the boundary of the second component mask pattern 302. The features on the modified mask pattern 340 are "negative" because the resulting pattern of photoresist material that is formed on the semiconductor substrate will include spaces or holes having outlines that correspond to the mask features 342/344/346/348. In other words, there will be a lack of photoresist material wherever the mask features 342/344/346/348 are present. The modified mask pattern 340 is void of any design rule violations, and a DRC on the modified mask pattern 340 would return clean results.

Referring back to FIG. 4, execution of task 214 results in a modified set of component mask patterns, where each mask pattern in the modified set is void of tip-to-tip and tip-to-line violations. The process 200 may then save data (task 216) corresponding to the original component mask patterns, the modified mask pattern(s), and the block mask pattern(s). This data can then be used to generate/create photolithographic masks for the block mask pattern(s) and for the modified set of component mask patterns. For this example, three different photolithographic masks will be created: one that defines the original first component mask pattern 300; one that defines the modified mask pattern 340; and one that defines the block mask pattern 320. These masks are then utilized to form certain semiconductor device features during fabrication of a semiconductor device (e.g., an SRAM device). In this regard, an exemplary fabrication process is described below with reference to FIGS. 9-20.

FIGS. 9-20 include cross-sectional and top views of a semiconductor device structure undergoing a multiple exposure/pattern fabrication process. This fabrication process can be employed to manufacture a semiconductor device having extremely close tolerances between device features and/or very narrow line widths. For simplicity and consistency, this fabrication process utilizes the three photolithographic masks described above, namely, the first component mask, the modified mask, and the block mask. Thus, the exemplary fabrication process described here can be used to create device features on an SRAM device structure.

Figure 9:
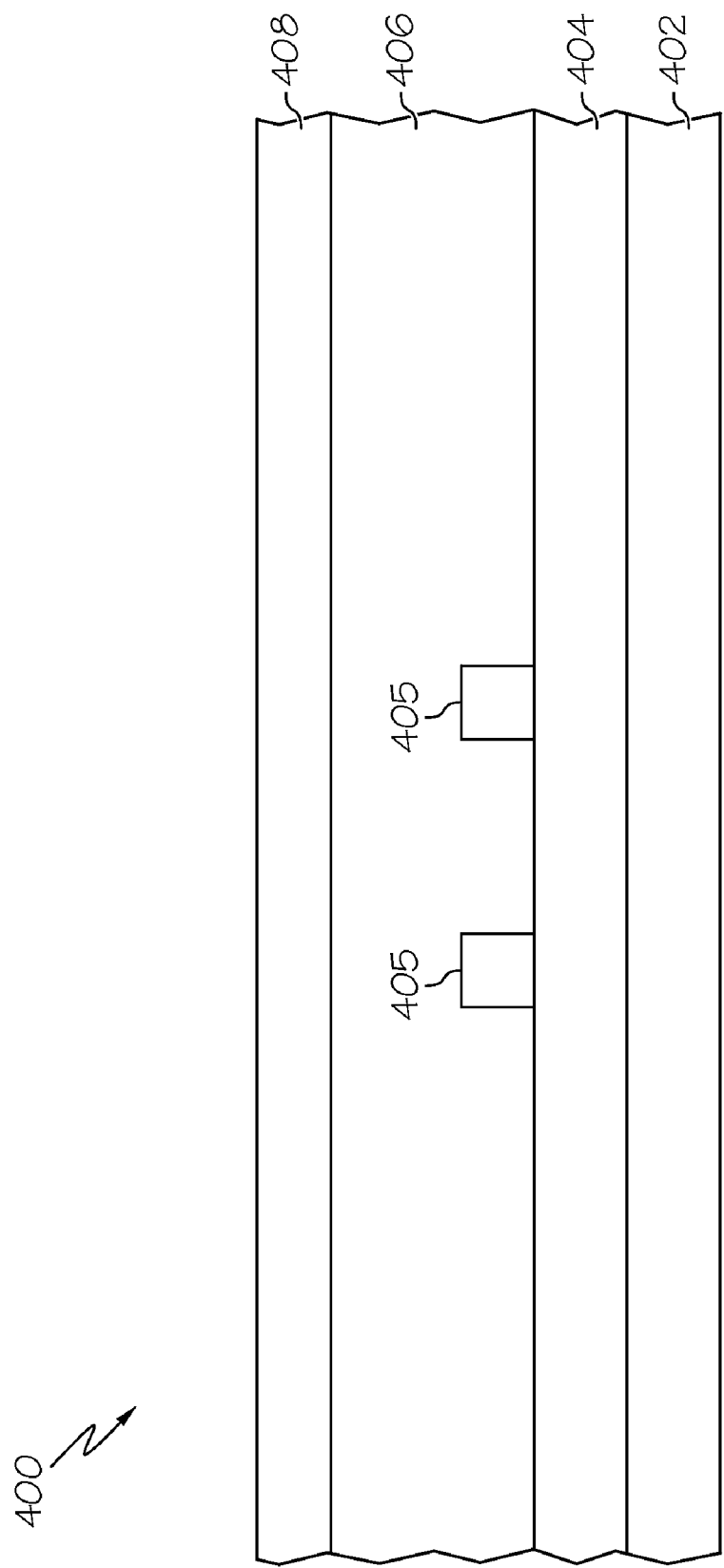
FIGS. 9-20 are cross-sectional and top views illustrating a semiconductor device structure undergoing an exemplary fabrication process.

FIG. 9 depicts an exemplary semiconductor device structure 400 after a target material has been formed thereon. At this point in the process, the semiconductor device structure 400 includes, without limitation: a layer of semiconductor material 402; a first layer of insulating material 404 overlying the layer of semiconductor material 402; two gate structures 405 formed overlying the first layer of insulating material 404; a second layer of insulating material 406 overlying the first layer of insulating material 404 and covering the gate structures 405; and a layer of hard mask material 408 overlying the second layer of insulating material. Referring to FIG. 2, the cross-sectional views contained in FIGS. 9-20 correspond to a tip-to-tip local interconnect region proximate two gate structures, but where no active semiconductor region is located between the tips of the local interconnects. It should be appreciated that the cross-sectional composition of the semiconductor device structure 400 will be different in regions that include no gate structure, in regions that include an active semiconductor region, etc.

The semiconductor material 402 is preferably a silicon material as typically used in the semiconductor industry, e.g., relatively pure silicon as well as silicon admixed with other elements such as germanium, carbon, and the like. Alternatively, the semiconductor material 402 can be germanium, gallium arsenide, or the like. The semiconductor material 402 can be either N-type or P-type, but is typically P-type, with wells of the appropriate type formed therein. The semiconductor material 402 may be provided as a bulk semiconductor substrate, or it could be provided on a silicon-on-insulator (SOI) substrate, which includes a support substrate, an insulator layer on the support substrate, and a layer of silicon material on the insulator layer.

For this embodiment, the first layer of insulating material 404 represents shallow trench isolation (STI) for the semiconductor device structure. In certain embodiments, the STI material used for the first layer of insulating material 404 is an oxide material, such as a tetraethyl orthosilicate (TEOS) oxide, a high density plasma oxide, or the like. The second layer of insulating material 406 is used to form trenches that are filled to create the desired pattern of local interconnects. At this point in the fabrication process, the second layer of insulating material 406 encapsulates the gate structures 405 (which are simplistically depicted as blocks, although in reality each of the gate structures 405 can be realized as a stack of various layers of material, as is well understood). Depending upon the embodiment, the second layer of insulating material 406 may include an oxide material such as, without limitation, a TEOS oxide. It should be appreciated that the semiconductor device structure will typically include a thin contact etch stop layer (for example, a nitride layer) between the first layer of insulating material 404 and the second layer of insulating material 406. This thin contact etch stop layer is not depicted in FIG. 9. In typical embodiments, the second layer of insulating material 406 has a thickness in the range of about 100 nm to about 250 nm, although other thicknesses could be utilized if so desired.

The layer of hard mask material 408 is formed overlying the second layer of insulating material 406 using, for example, an appropriate deposition technique, such as chemical vapor deposition (CVD), low pressure CVD (LPCVD), plasma enhanced CVD (PECVD), atmospheric pressure CVD (APCVD), physical vapor deposition (PVD), atomic layer deposition (ALD), or the like. In some embodiments, a layer of anti-reflective coating (not shown) can be formed over the layer of hard mask material 408. In various embodiments, the anti-reflective coating can include one or more of an organic bottom anti-reflective coating (BARC) layer, an inorganic BARC layer, and a hybrid organic-inorganic BARC layer. Although preferred embodiments utilize a CVD material, the hard mask material 408 could be a thermally grown material in alternate embodiments. In practice, the hard mask material 408 is a dielectric material such as a nitride, preferably, silicon nitride, and the hard mask material 408 is formed with a typical thickness of about 20 nm to about 500 nm, although the thickness could be outside of this typical range, depending upon the embodiment. The hard mask material 408 could also comprise one or more of silicon carbide, oxygen doped silicon carbide, nitrogen doped silicon carbide, oxygen doped silicon nitride, carbon doped silicon nitride, and oxygen and carbon doped silicon nitride.

Figure 10:
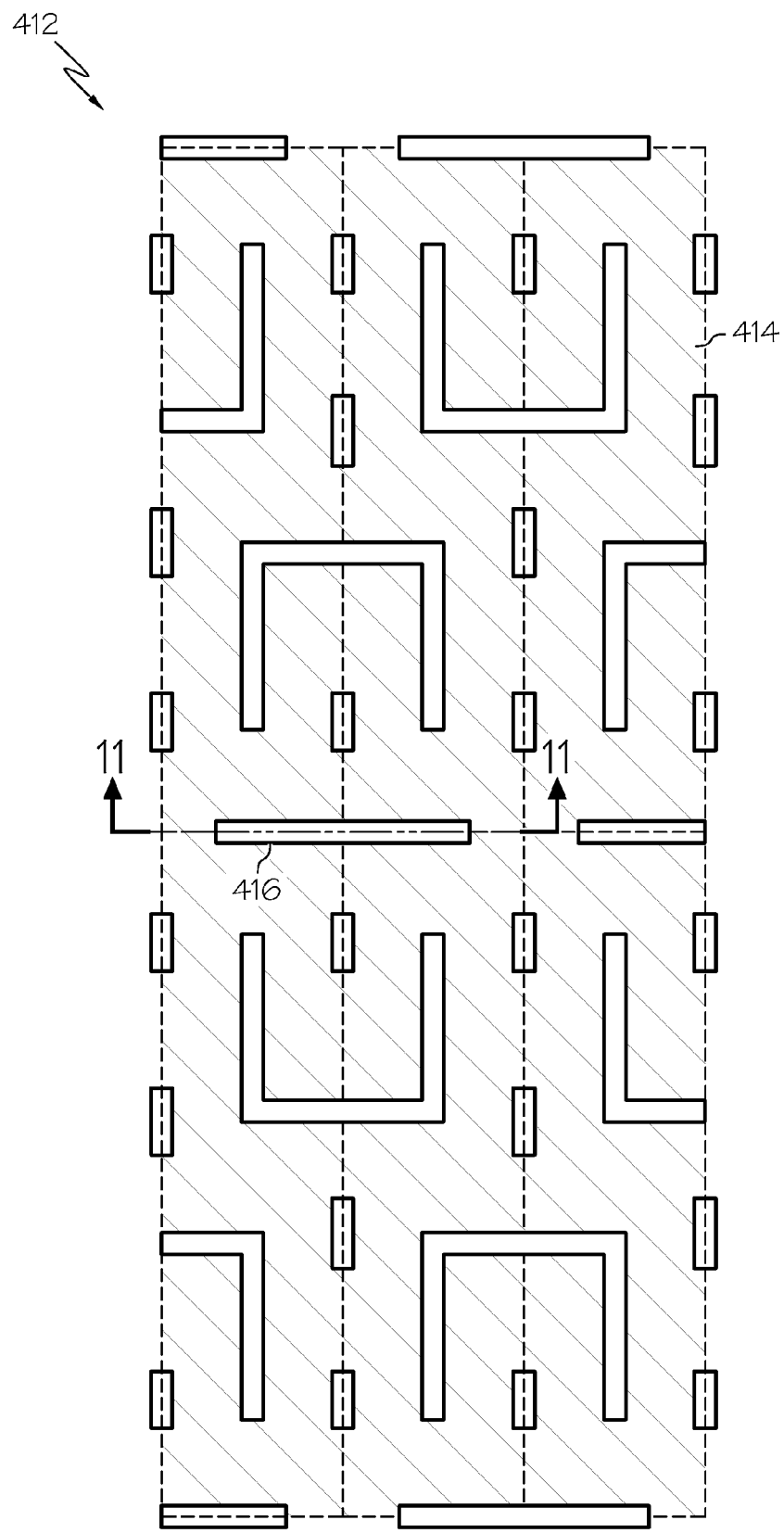
Figure 11:
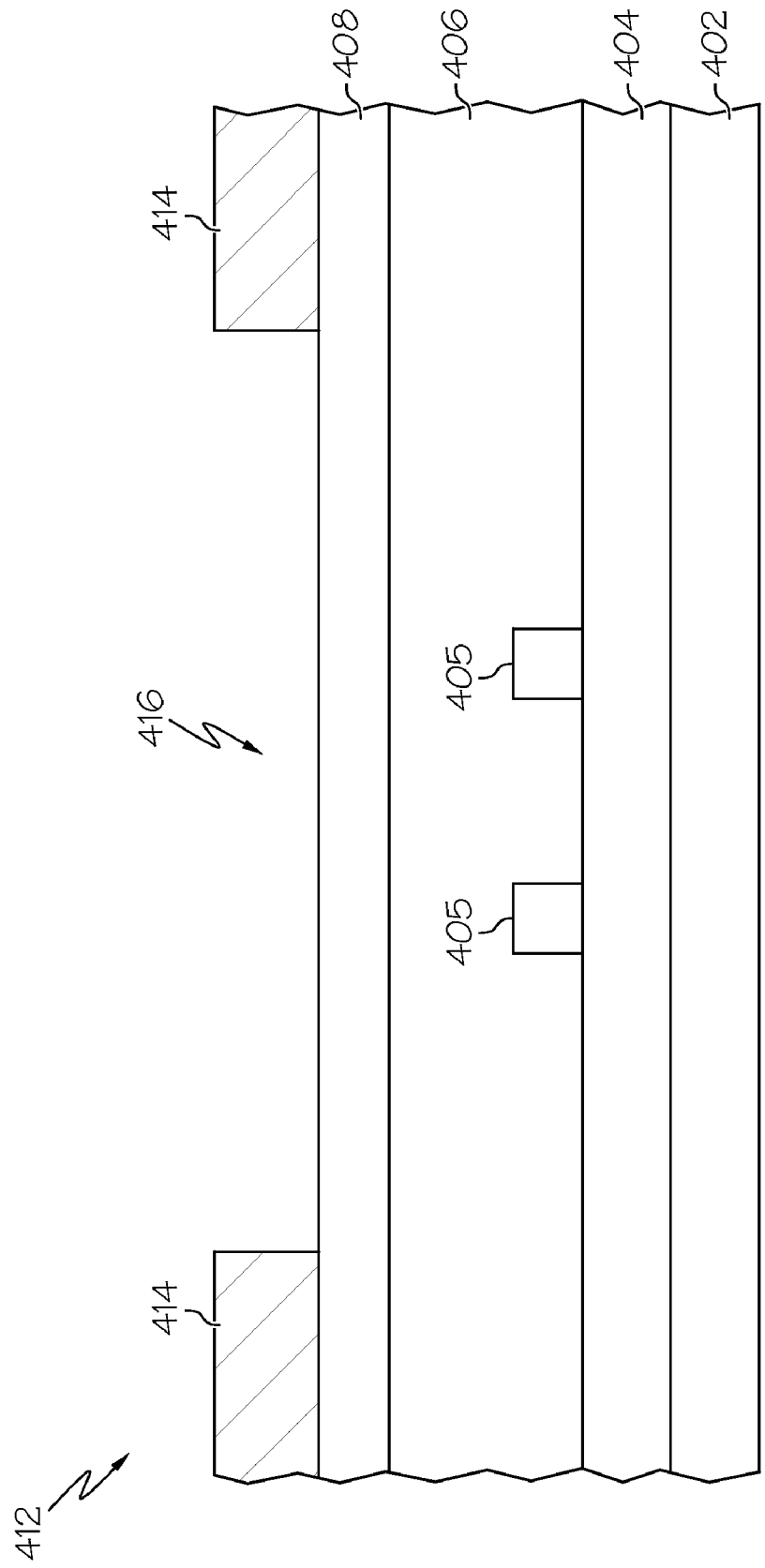

After providing the layer of hard mask material 408, the fabrication process may continue by performing a multiple exposure/pattern photolithography procedure, using appropriate photolithographic masks. For this example, the masks corresponding to the first component mask pattern 300 and the modified mask pattern 340 are used to form initial photoresist features on the semiconductor device structure 400. FIG. 10 is a top view of the semiconductor device structure 412 after a combined pattern of features has been formed in photoresist material 414 overlying the layer of hard mask material 408, and FIG. 11 is a cross-sectional view of the semiconductor device structure 412 as viewed from line 11-11 in FIG. 10. FIG. 11 depicts a negative mask feature 416 formed in the photoresist material 414. As shown in FIG. 10, this negative mask feature 416 represents one of the merged horizontal features associated with the modified mask pattern. The photoresist material 414 includes a plurality of negative mask features formed therein, as shown in FIG. 10. For the reasons mentioned above, the photolithography steps result in a combined pattern of photoresist features that will be void of tip-to-tip and tip-to-line design rule violations.

Figure 12:
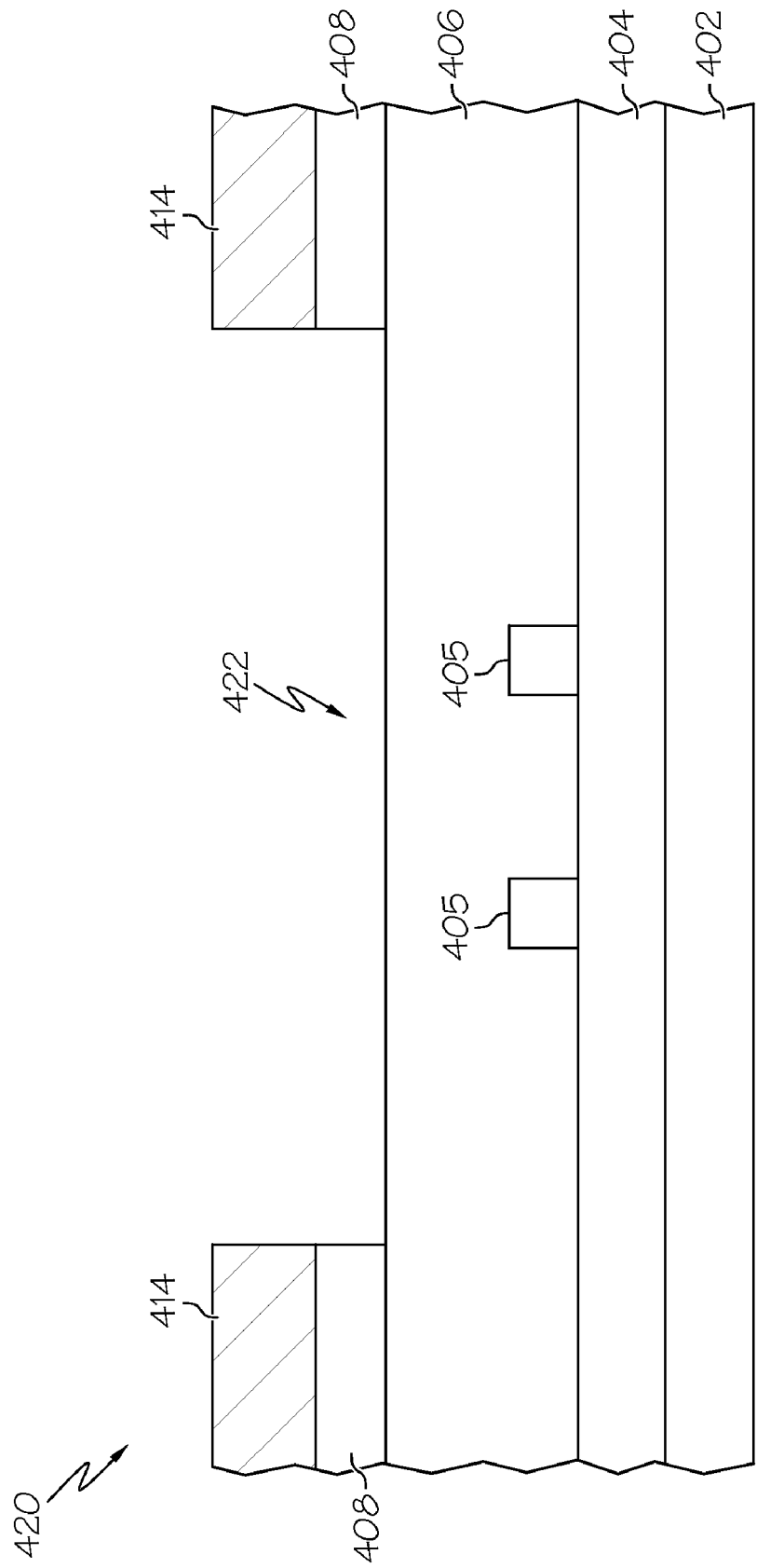

The fabrication process can then continue by selectively etching the layer of hard mask material 408 using the combined pattern of photoresist features as an etch mask. FIG. 12 depicts the semiconductor device structure 420 after the layer of hard mask material 408 has been etched. The etching technique and etch chemistry used during this step is selected such that the layer of hard mask material 408 (e.g., a nitride material) is selectively removed while the photoresist material 414 and the underlying second layer of insulating material 406 remain intact. Suitable chemical and/or physical etching techniques and etch chemistries may be used, including, without limitation: fluorine based plasma etch; reactive ion etch; fluorine-based chemistry etching, alternatively argon and oxygen. This etching step results in a recess line pattern 422 formed in the layer of hard mask material 408. In this regard, the remaining hard mask material 408 corresponds to a positive hard mask pattern, with the negative recess line pattern 422 defined therein. As depicted in FIG. 12, the recess line pattern 422 is formed in a self-aligned manner with the features that are present in the photoresist material 414. In other words, the recess line pattern 422 will be defined by the combined pattern of photoresist features. Consequently, the top view of the recess line pattern 422 will have the same general appearance as shown in FIG. 10, and at least some of the recess line pattern 422 will include bidirectional recess lines.

Figure 13:
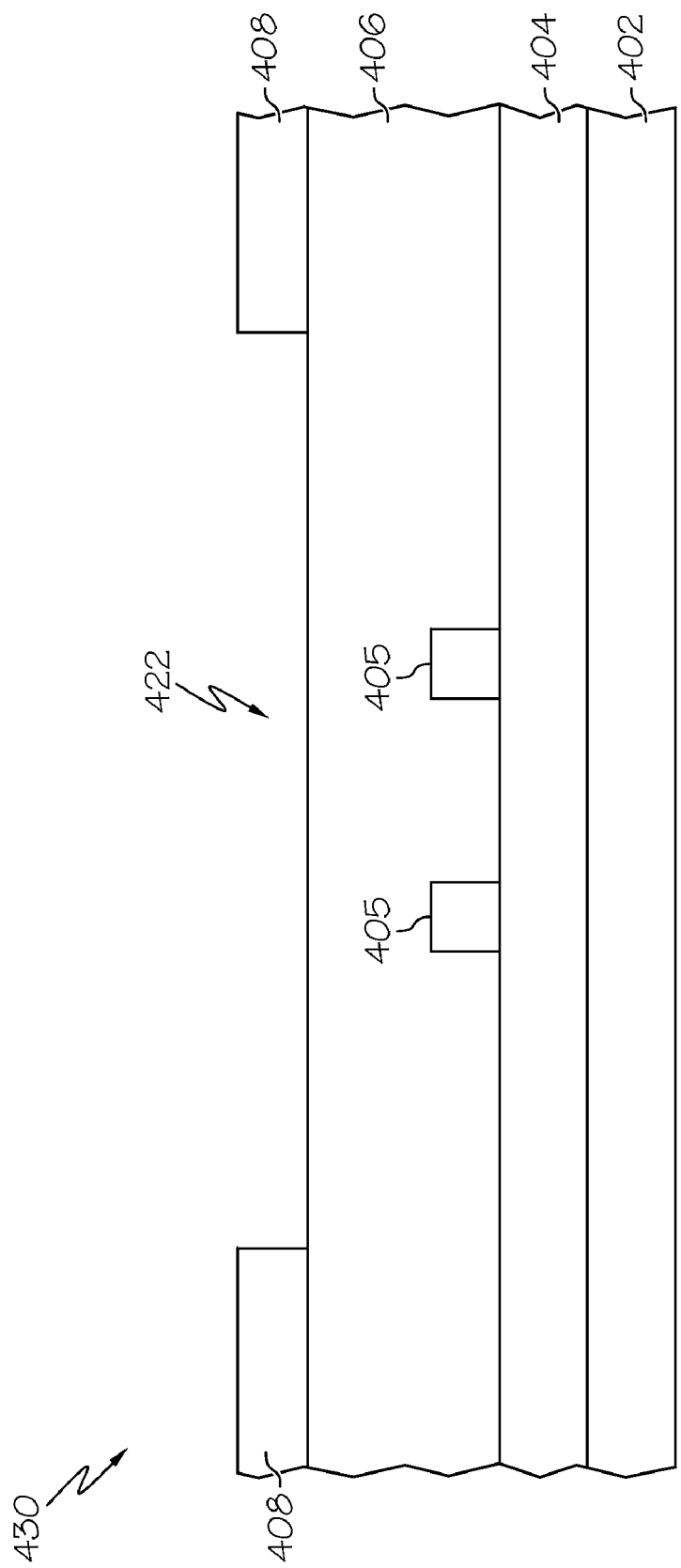
Figure 14:
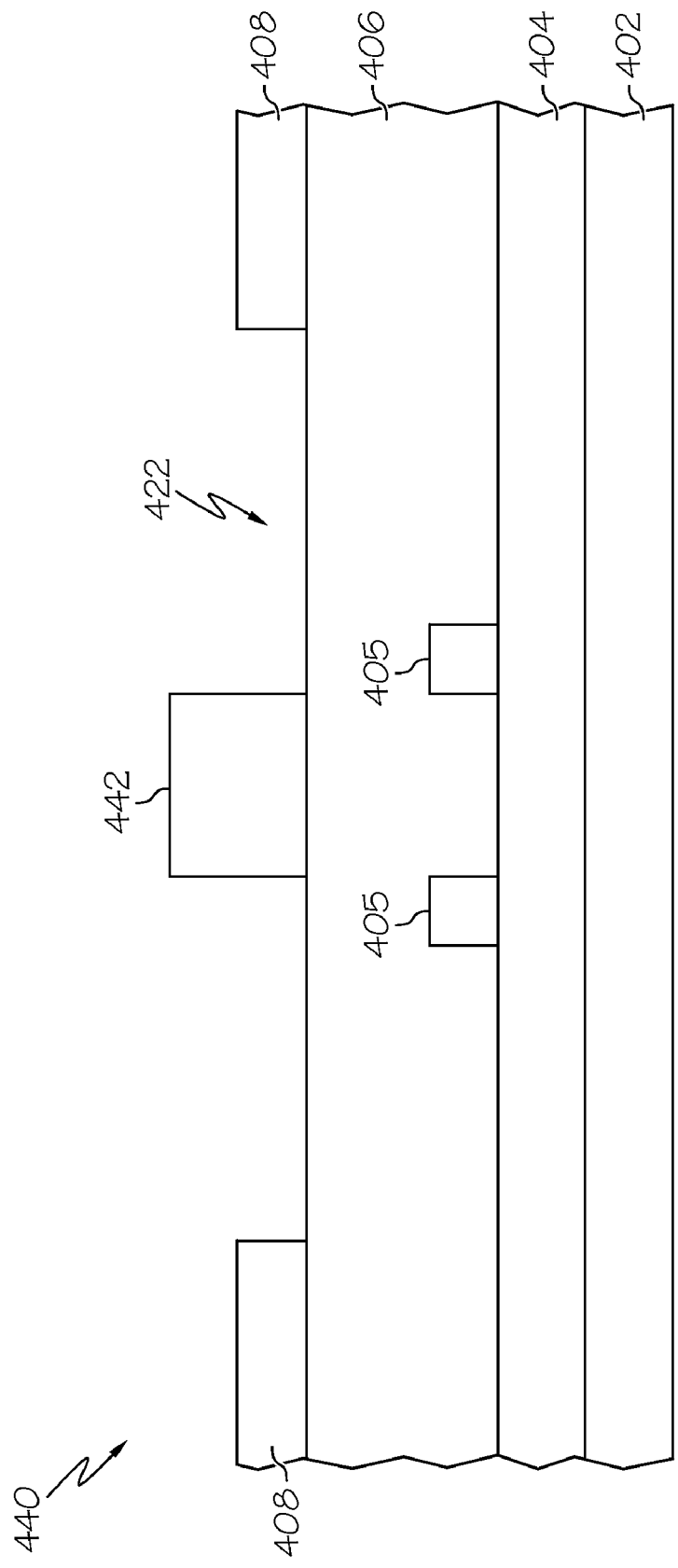

The fabrication process continues by removing the photoresist material 414 from the hard mask material 408, resulting in the semiconductor device structure 430 depicted in FIG. 13. The recess line pattern 422 remains defined in the hard mask material 408 after removal of the photoresist material 414. Thereafter, the fabrication process forms a blocking pattern of photoresist features that cover designated sections of the recess line pattern 422. FIG. 14 depicts the state of the semiconductor device structure 440 after formation of the blocking pattern of photoresist features 442. For this embodiment, the formation of the blocking pattern exposes some of the second insulating material 406, while other portions of the second insulating material 406 remain protected by the blocking pattern of photoresist features 442. The blocking pattern of photoresist features 442 is formed on or overlying some of the exposed portions of the second insulating material 406, as shown in FIG. 14.

Figure 15:
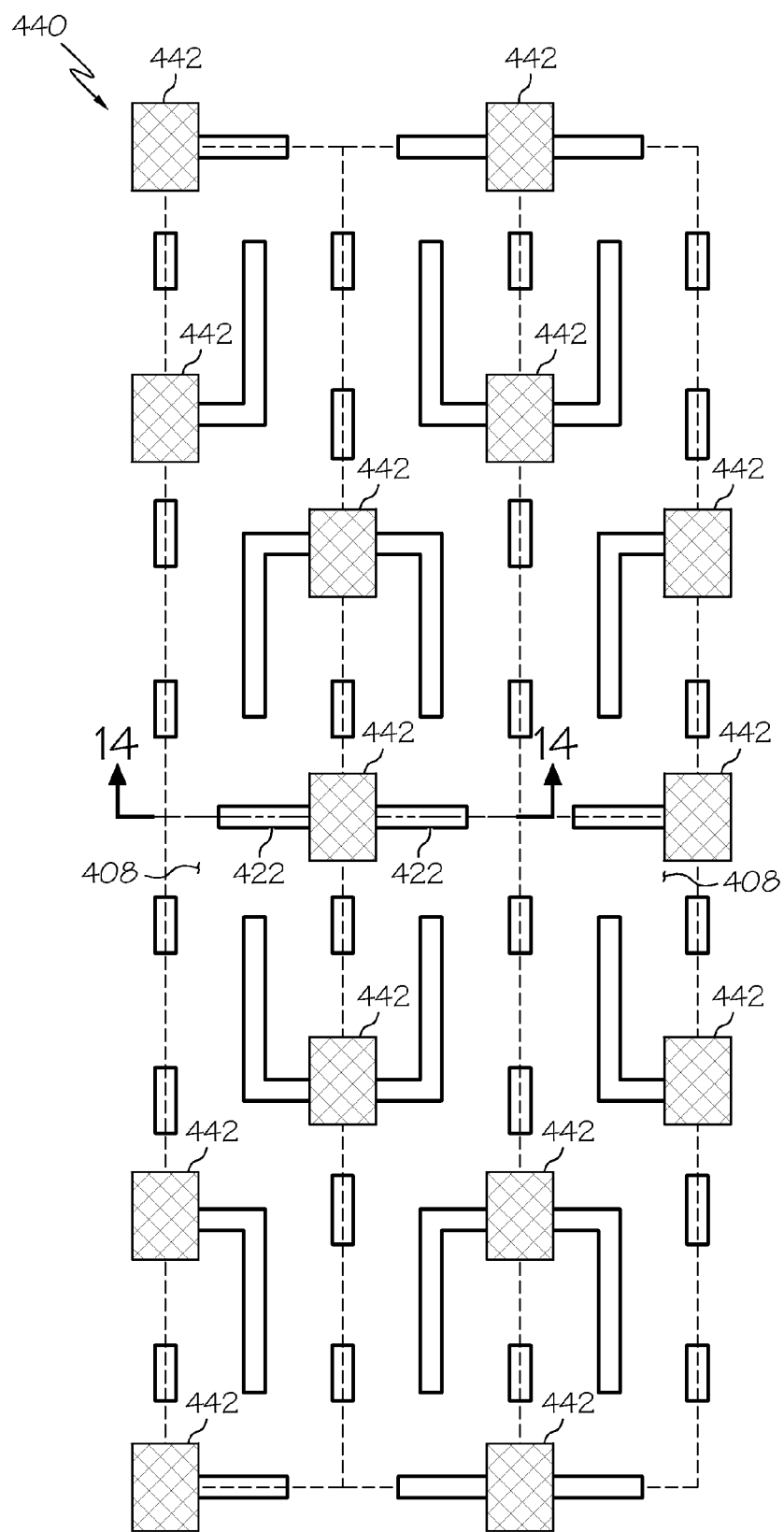

This blocking pattern of photoresist features 442 can be created by exposing a layer of photoresist material using a photolithographic mask that corresponds to the block mask pattern 320 depicted in FIG. 7. After the exposed photoresist material is developed, the remaining photoresist material represents the blocking pattern of photoresist features 442. For the reasons mentioned above, the blocking pattern of photoresist features 442 will be void of tip-to-tip and tip-to-line design rule violations. FIG. 15 is a top view of the semiconductor device structure 440 after creation of the blocking pattern of photoresist features 442. FIG. 15 includes a cross-sectional line 14-14 that indicates the perspective of FIG. 14. Notably, the blocking pattern of photoresist features 442 includes a number of individual blocks, each of which overlies the second layer of insulating material 406. Moreover, the blocking pattern of photoresist features 442 intersects one or more of the recess lines defined in the recess line pattern 422. For the embodiment illustrated in FIG. 15, the blocks overlap the recess lines and they extend beyond the boundaries of the recess lines in the direction orthogonal to the dimensions of the tip-to-tip violations (without interfering with adjacent features).

Figure 16:
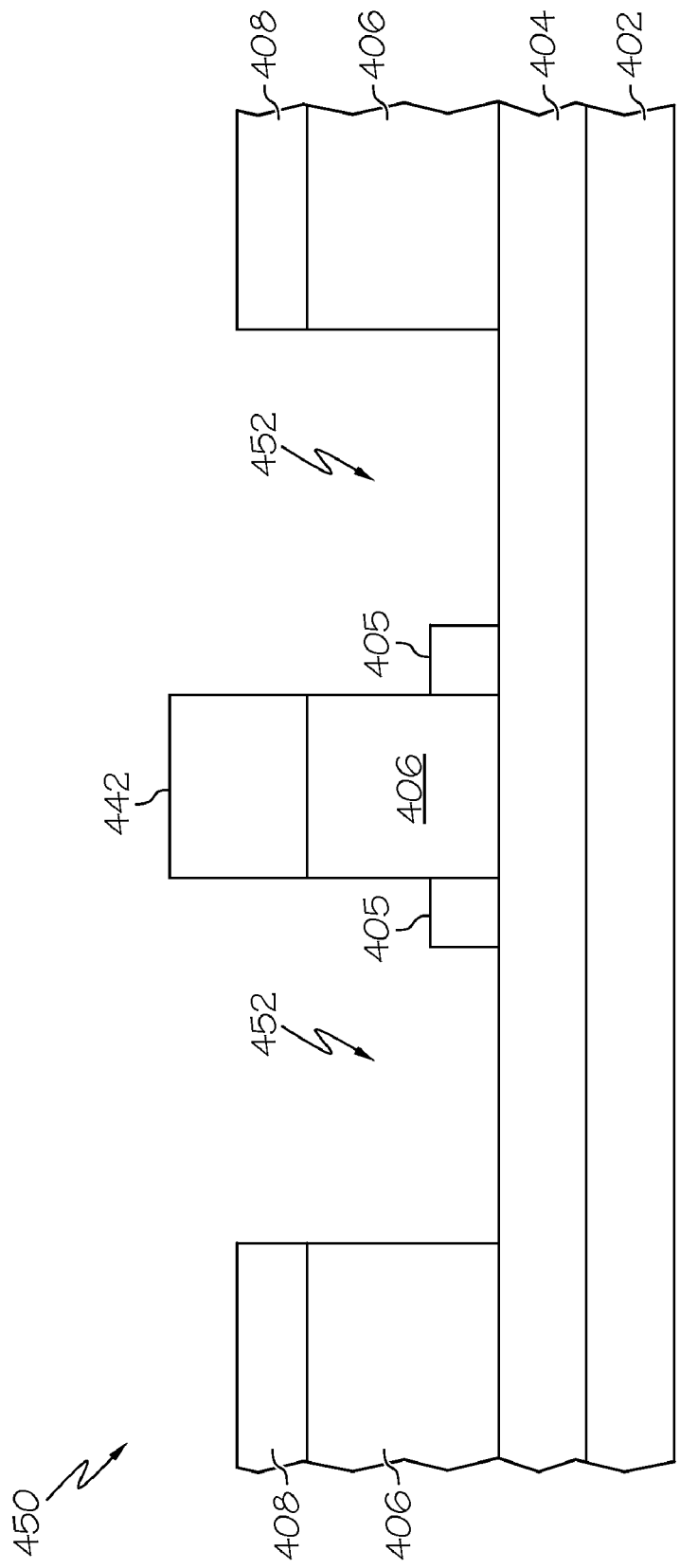

The fabrication process may proceed by selectively etching the second layer of insulating material 406 using the hard mask material 408 and the blocking pattern of photoresist features 442 as an etch mask. FIG. 16 depicts the semiconductor device structure 450 after the second layer of insulating material 406 has been etched. The etching technique and etch chemistry used during this step is selected such that the second layer of insulating material 406 (e.g., an oxide) is selectively removed while the hard mask material 408, the photoresist material used for the blocking pattern of photoresist features 442, the gate structures 405, and the underlying first layer of insulating material 404 remain substantially intact. The trenches 452 depicted in FIG. 16 are formed such that they terminate at or near the first layer of insulating material 404. In practice, this etching step might form some slight recesses in the first layer of insulating material 404, however, these recesses can be controlled such that they do not adversely impact the overall fabrication process or the performance of the resulting devices. As one example, a suitable etching technique and etch chemistry includes, without limitation, fluorine-based chemistry etching. This etching step results in a pattern of trenches 452 formed in the second layer of insulating material 406. As depicted in FIG. 16, the pattern of trenches 452 is formed in a self-aligned manner with the hard mask material 408 and the blocking pattern of photoresist features 442. In other words, the pattern of trenches 452 will be defined by the blocking pattern of photoresist features 442 and the hard mask material 408. Consequently, the top view of the pattern of trenches 452 will have the same general appearance as shown in the top view of FIG. 15, and at least one of the trenches in the pattern of trenches 452 will be bidirectional.

Notably, the blocking pattern of photoresist features 442 protects areas of the second layer of insulating material 406 such that all of the features defined in the modified mask pattern 340 (FIG. 8) are not actually realized. Moreover, since the blocking pattern of photoresist features 442 is based upon the identified violations 308/310 (FIG. 6), the resulting pattern of trenches 452 corresponds to the originally designed overall mask pattern for the semiconductor device.

As mentioned previously, the cross-sectional view of FIG. 16 corresponds to a location on the semiconductor device structure 450 that does not include an underlying active semiconductor region. For areas of the semiconductor device structure 450 that do contain an underlying active semiconductor region, the pattern of trenches 452 may extend into one or more additional layers or regions of the substrate (which would be located at a cross-sectional location other than that shown in FIG. 16, e.g., at a location corresponding to a point further into or out of the page in FIG. 16). For example, in certain areas of the semiconductor device structure 450, at least one trench could be formed such that no gate structure is located within the trench. As yet another example, in certain areas of the semiconductor device structure 450, it may be necessary to form at least one trench such that it terminates at an active transistor region, e.g., a source region or a drain region.

Figure 17:
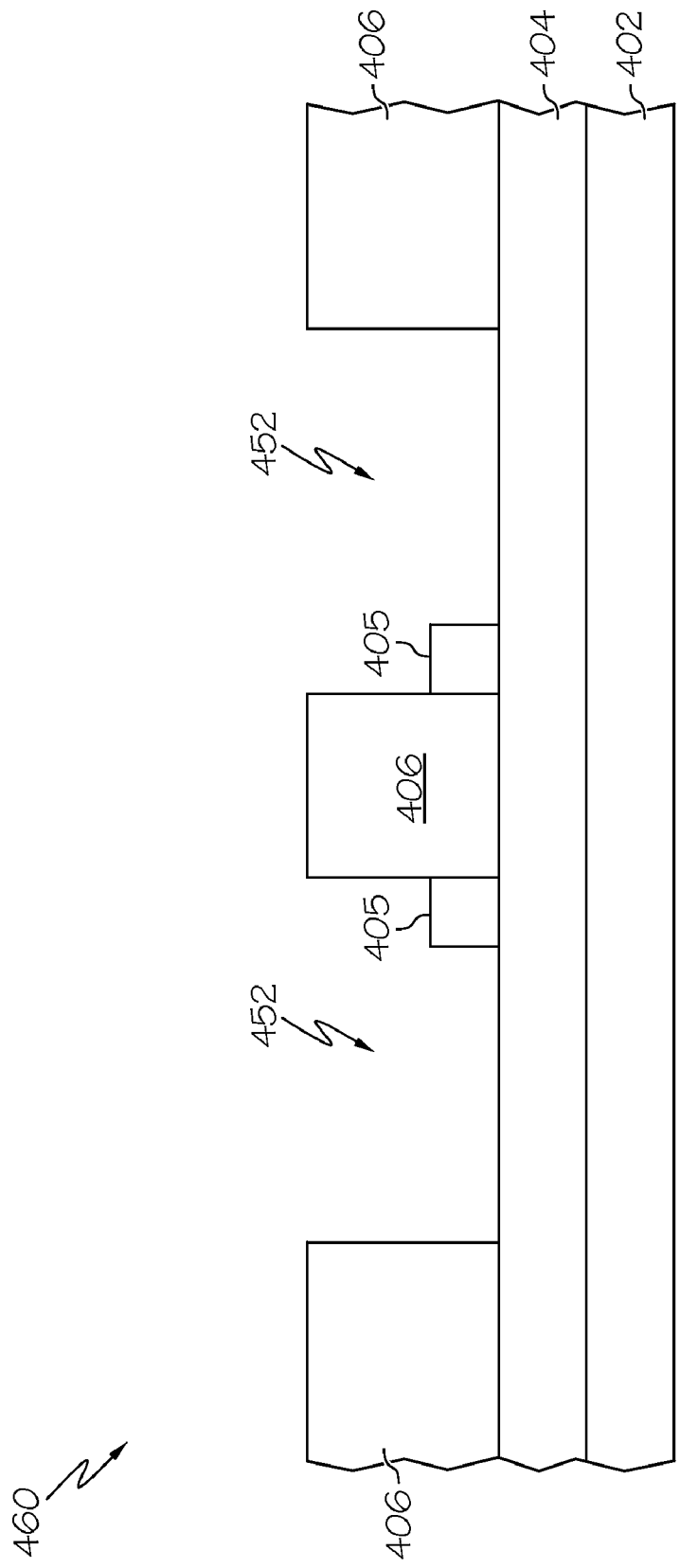

The fabrication process proceeds by removing the blocking pattern of photoresist features 442 and the hard mask material 408, resulting in the semiconductor device structure 460 depicted in FIG. 17. In practice, the blocking pattern of photoresist features 442 is removed using, for example, a selective wet chemical etch, and the hard mask material 408 is removed using, for example, a selective plasma or chemical etch. Depending upon the specific materials used, it may also be possible to remove the blocking pattern of photoresist features 442 and the hard mask material 408 using a single etching process.

Figure 18:
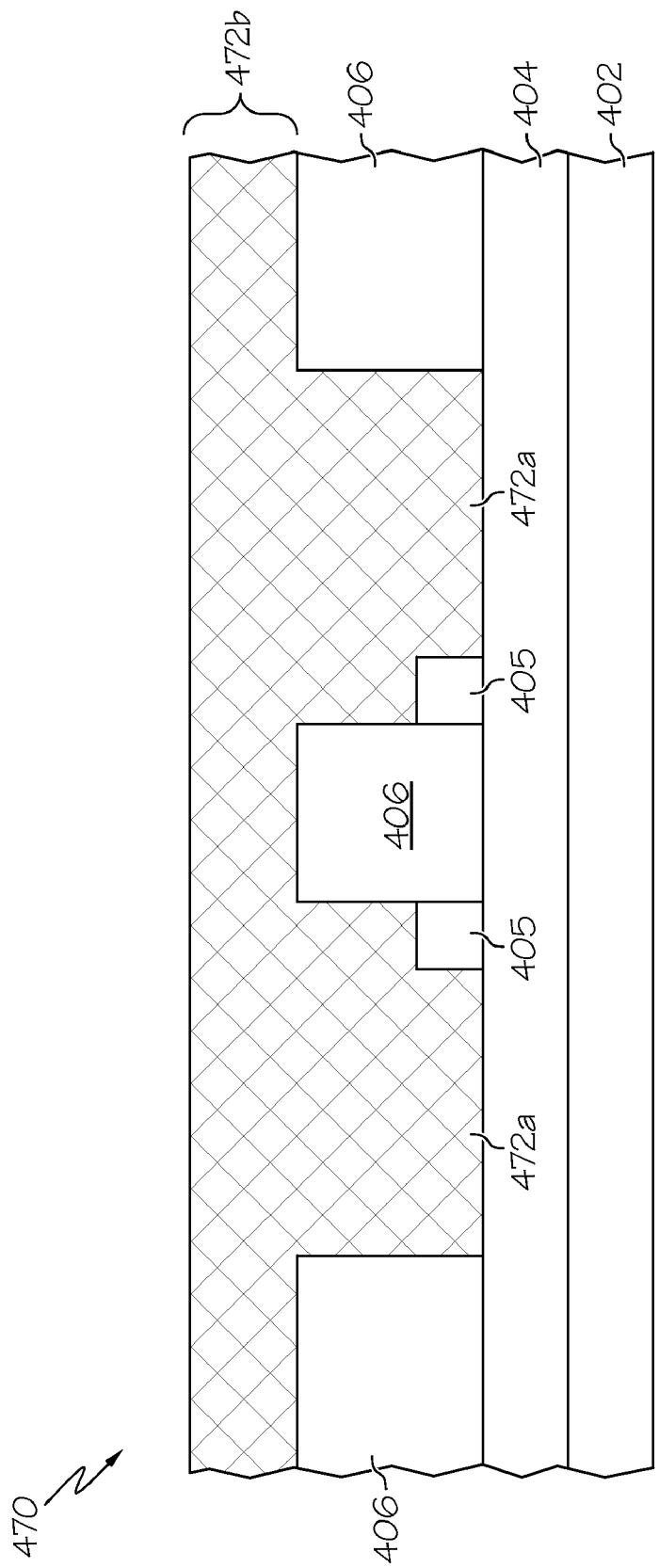

The fabrication process continues by at least partially filling the trenches with an electrically conductive material. In certain embodiments, the trenches are completely filled with the electrically conductive material. Indeed, the fabrication process will typically "overfill" the trenches, resulting in some overburden material overlying the first layer of insulating material 406. The resulting semiconductor device structure 470 is shown in FIG. 18. As shown in FIG. 18, the trenches have been filled with the electrically conductive material 472a, and some of the electrically conductive material 472b is also formed overlying the first layer of insulating material 406. Moreover, the electrically conductive material 472a overlies and covers the gate structures 405 (thus, electrically conductive elements of the gate structures 405, e.g., silicide contact regions, will be electrically coupled to the electrically conductive material 472a). In certain embodiments, the electrically conductive material 472 is a metal material (e.g., a tungsten material, a copper material, or the like) that is deposited using, for example, a CVD process, a sputtering process, or the like.

Figure 19:
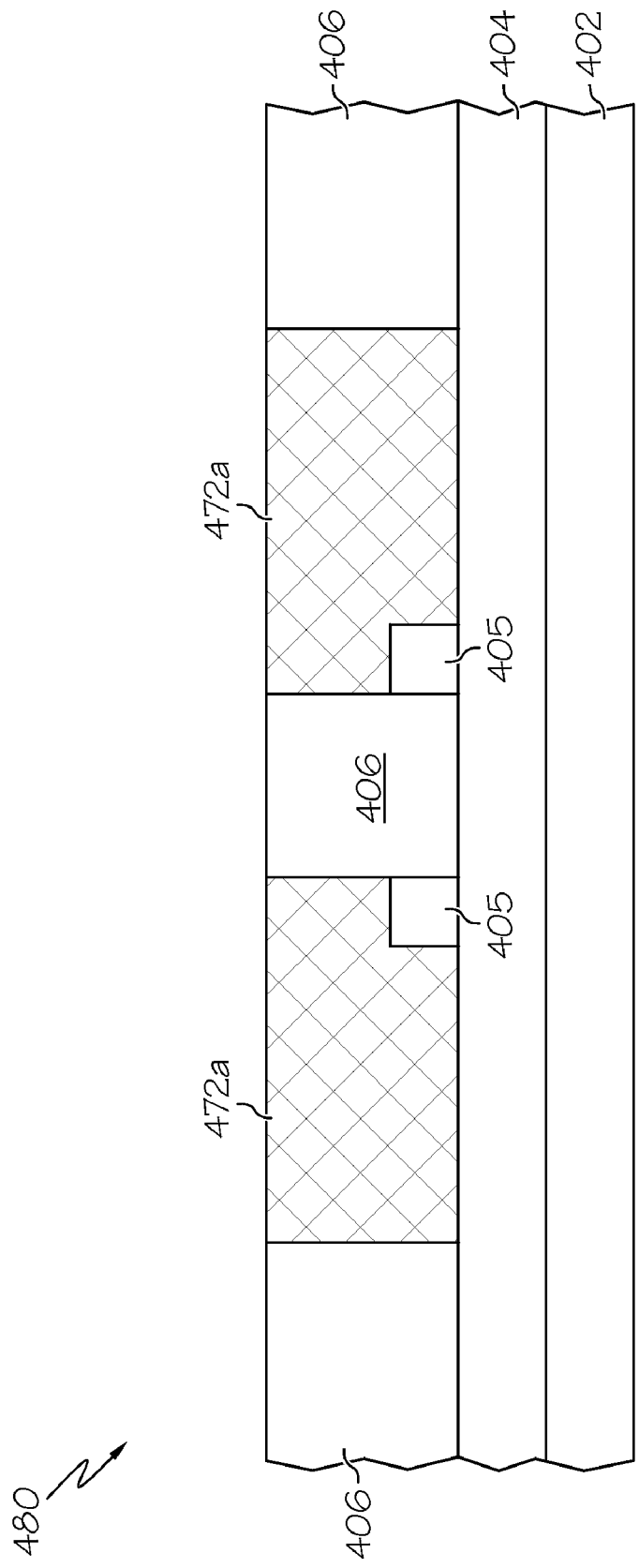

After the electrically conductive material 472 has been deposited, the fabrication process removes the overburden portion of the electrically conductive material 472b, which results in the semiconductor device structure 480 shown in FIG. 19. The overburden portion of the electrically conductive material 472b is removed using, for example, a chemical mechanical polishing procedure that stops after the upper surface of the second layer of insulating material 406 has been exposed. Accordingly, the exposed surface of the electrically conductive material 472a is substantially planar with the exposed surface of the second layer of insulating material 406.

Figure 20:
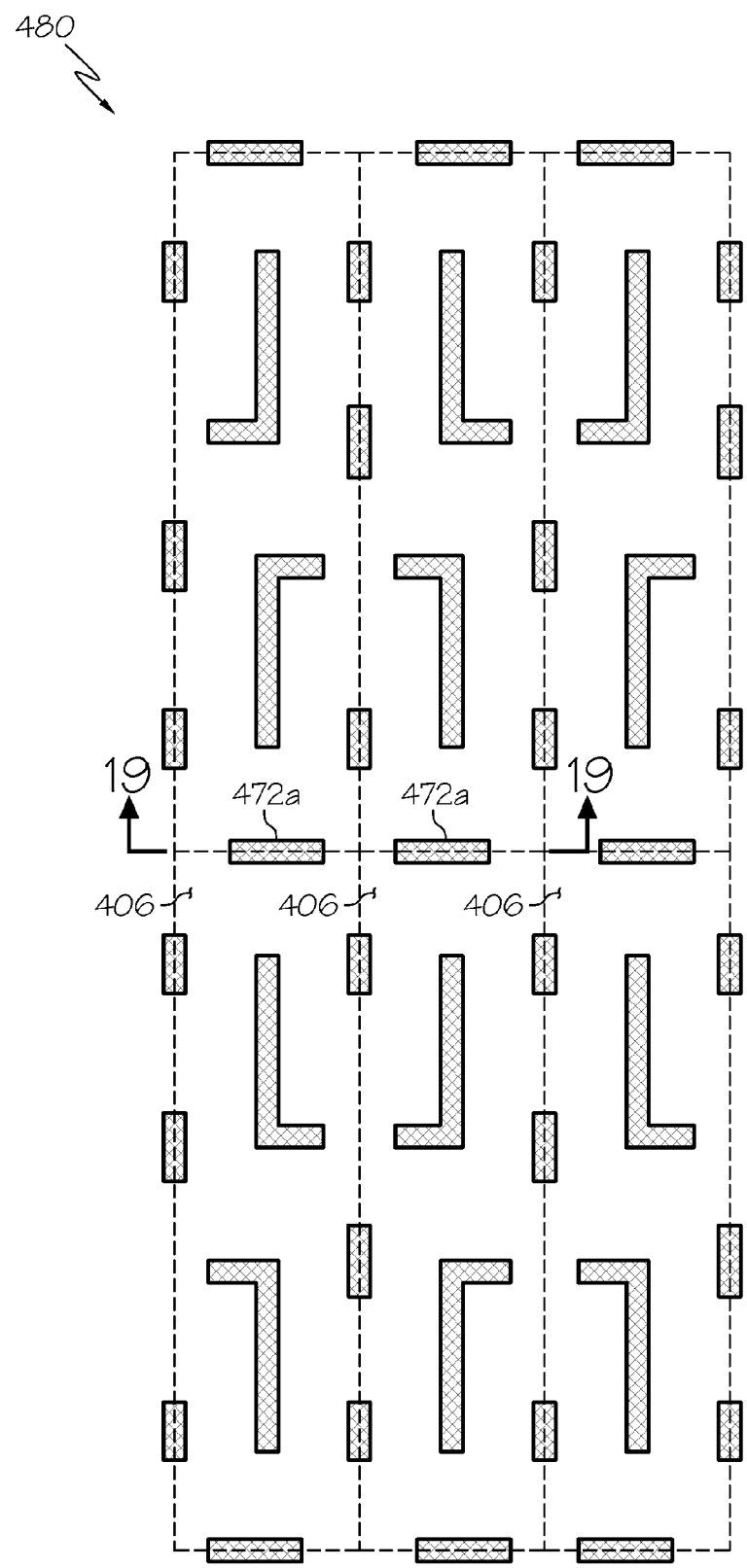

The resulting layout of the electrically conductive material 472a on the semiconductor device structure 480 represents the desired pattern of conductive local interconnects for the semiconductor device. FIG. 20 is a top view of the semiconductor device structure 480 after creation of the local interconnects, which comprise the electrically conductive material 472. FIG. 20 includes a cross-sectional line 19-19 that indicates the perspective of FIG. 19. Notably, the pattern of local interconnects includes many distinct segments of the electrically conductive material 472 surrounded by areas of the second layer of insulating material 406. The pattern of local interconnects shown in FIG. 20 corresponds to that utilized for the array of SRAM cells 150 shown in FIG. 2.

After the local interconnects have been created for the semiconductor device structure 480, any number of additional process steps can be performed to complete the fabrication of the semiconductor device or devices on the substrate. These backend process steps will not be described in detail here.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of creating device features on a semiconductor device structure, the method comprising:
   creating a first pattern of negative photoresist features overlying a target material of the semiconductor device structure, the first pattern of negative photoresist features defined by a first component photolithographic mask, wherein the first pattern of negative photoresist features is void of tip-to-tip and tip-to-line design rule violations;
   creating a second pattern of negative photoresist features overlying the target material, the second pattern of negative photoresist features defined by a second component photolithographic mask, the first pattern of negative photoresist features and the second pattern of negative photoresist features together forming a combined pattern of negative photoresist features, wherein the second pattern of negative photoresist features is void of tip-to-tip and tip-to-line design rule violations, the combined pattern of negative photoresist features is void of tip-to-tip and tip-to-line design rule violations;

selectively etching the target material, using the combined pattern of negative photoresist features as an etch mask, resulting in a recess line pattern formed in the target material; and after selectively etching the target material, forming a third pattern of positive photoresist features that intersect and cover designated sections of the recess line pattern, wherein the third pattern of positive photoresist features is void of tip-to-tip and tip-to-line design rule violations.

2. The method of claim 1, wherein:
the target material is formed overlying a layer of a second material;
selectively etching the target material exposes some of the second material; and
the forming step forms the third pattern of positive photoresist features on exposed portions of the second material.

3. The method of claim 2, further comprising selectively etching the second material, using the target material and the third pattern of positive photoresist features as a second etch mask, resulting in trenches formed in the second material.

4. The method of claim 3, further comprising at least partially filling the trenches with an electrically conductive material.

5. The method of claim 3, wherein at least one of the trenches is bidirectional.

6. A method of fabricating a semiconductor device, the method comprising:
providing a semiconductor device structure comprising a layer of semiconductor material and a layer of insulating material overlying the layer of semiconductor material;
forming a layer of hard mask material overlying the layer of insulating material;
creating a combined pattern of negative photoresist features overlying the layer of hard mask material, the combined pattern of negative photoresist features comprising first negative photoresist features formed using a first photolithographic mask and second negative photoresist features formed using a second photolithographic mask, wherein each of the first negative photoresist features, the second negative photoresist features, and the combined pattern of negative photoresist features is void of tip-to-tip and tip-to-line design rule violations;
selectively etching the layer of hard mask material using the combined pattern of negative photoresist features as an etch mask, resulting in a positive hard mask pattern and a negative recess line pattern defined in the hard mask material; and
after selectively etching the layer of hard mask material, creating a pattern of positive photoresist features overlying the insulating material, the positive photoresist features intersecting and covering one or more recess lines defined in the negative recess line pattern, wherein the pattern of positive photoresist features is void of tip-to-tip and tip-to-line design rule violations.

7. The method of claim 6, further comprising selectively etching the insulating material using the positive hard mask pattern and the positive photoresist features as a second etch mask, resulting in trenches formed in the insulating material.

8. The method of claim 7, further comprising:
removing the positive hard mask pattern from the semiconductor device structure; and
removing the positive photoresist features from the semiconductor device structure.

9. The method of claim 8, further comprising depositing an electrically conductive material in the trenches.

10. The method of claim 7, wherein at least one of the trenches is bidirectional.

11. A method of fabricating a semiconductor device, the method comprising:
forming a layer of hard mask material on a substrate comprising a layer of semiconductor material and a layer of insulating material overlying the layer of semiconductor material, the layer of hard mask material overlying the layer of insulating material;
performing a multiple exposure photolithography procedure to create a combined pattern of negative photoresist features overlying the layer of hard mask material, wherein the combined pattern of negative photoresist features is void of tip-to-tip and tip-to-line design rule violations;
forming a recess line pattern in the hard mask material, the recess line pattern being defined by the combined pattern of negative photoresist features;
covering designated sections of the recess line pattern with a blocking pattern of positive photoresist features, wherein the blocking pattern of positive photoresist features is void of tip-to-tip and tip-to-line design rule violations;
forming a pattern of trenches in the insulating material, the pattern of trenches being defined by the blocking pattern of positive photoresist features and by the recess line pattern in the hard mask material; and
depositing an electrically conductive material in the trenches, resulting in conductive lines for the semiconductor device.

12. The method of claim 11, wherein forming the recess line pattern comprises etching the layer of hard mask material using the combined pattern of negative photoresist features as an etch mask.

13. The method of claim 11, wherein forming the pattern of trenches comprises etching the layer of insulating material using the blocking pattern of positive photoresist features and the hard mask material as an etch mask.

14. The method of claim 13, wherein forming the pattern of trenches further comprises etching a second layer of insulating material underlying the layer of insulating material, using the blocking pattern of positive photoresist features and the hard mask material as an etch mask.

15. The method of claim 11, wherein forming the pattern of trenches comprises forming at least one trench such that it terminates at a transistor gate structure of the semiconductor device.

16. The method of claim 11, wherein forming the pattern of trenches comprises forming at least one trench such that it terminates at an active transistor region of the semiconductor device.

17. The method of claim 11, wherein forming the pattern of trenches comprises forming at least one trench such that it terminates at a second layer of insulating material underlying the layer of insulating material.

18. The method of claim 11, wherein forming the recess line pattern comprises forming a pattern of bidirectional recess lines.

* * * * *